US012434907B2

United States Patent
Kobayashi

(10) Patent No.: US 12,434,907 B2
(45) Date of Patent: Oct. 7, 2025

(54) TRANSPORT VEHICLE SYSTEM

(71) Applicant: MURATA MACHINERY, LTD., Kyoto (JP)

(72) Inventor: Makoto Kobayashi, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 403 days.

(21) Appl. No.: 18/036,701

(22) PCT Filed: Sep. 24, 2021

(86) PCT No.: PCT/JP2021/035104
§ 371 (c)(1),
(2) Date: May 12, 2023

(87) PCT Pub. No.: WO2022/107448
PCT Pub. Date: May 27, 2022

(65) Prior Publication Data
US 2023/0406622 A1  Dec. 21, 2023

(30) Foreign Application Priority Data

Nov. 18, 2020 (JP) .................. 2020-191794

(51) Int. Cl.
| | | |
|---|---|---|
| *H01L 21/00* | (2006.01) | |
| *B65G 1/04* | (2006.01) | |
| *B65G 43/00* | (2006.01) | |

(52) U.S. Cl.
CPC .......... *B65G 1/0457* (2013.01); *B65G 43/00* (2013.01); *B65G 2203/0233* (2013.01)

(58) Field of Classification Search
CPC ......... H01L 21/67259; H01L 21/67733; H01L 21/67736; H01L 21/681; H01L 21/6773
See application file for complete search history.

(56) References Cited

U.S. PATENT DOCUMENTS 10,381,251 B2 * 8/2019 Doherty ............ H01L 21/67769
2009/0035102 A1 * 2/2009 Zimmerhackl ... H01L 21/67769
414/800

(Continued)

FOREIGN PATENT DOCUMENTS

| JP | 10-194410 A | 7/1998 |
|---|---|---|
| JP | 2016-047747 A | 4/2016 |

(Continued)

OTHER PUBLICATIONS

Official Communication issued in International Patent Application No. PCT/JP2021/035104, mailed on Nov. 22, 2021.

*Primary Examiner* — Emmanuel M Marcelo
(74) *Attorney, Agent, or Firm* — Keating & Bennett, LLP

(57) ABSTRACT

A transport vehicle system includes a measurer to measure a measurement target portion, a measured portion including the measurement target portion thereon, and a control controller to cause a lifter to be lifted and lowered according to a set value and to control the lifting and lowering of the lifter so that the measurer can measure the measured portion by one of the measurer and the measured portion being gripped by a gripper and by the other of the measurer at a predetermined position and the measured portion at a predetermined position, and to correct the set value based on a result of measurement of the measured portion by the measurer.

18 Claims, 15 Drawing Sheets

(56) References Cited

U.S. PATENT DOCUMENTS

| | | | |
|---|---|---|---|
| 2017/0247190 A1 | 8/2017 | Horii et al. | |
| 2019/0164795 A1* | 5/2019 | Motoori | H01L 21/67769 |
| 2019/0375593 A1* | 12/2019 | Sai | H01L 21/67769 |
| 2020/0251366 A1* | 8/2020 | Wada | H01L 21/67733 |
| 2022/0059380 A1 | 2/2022 | Wada | |
| 2022/0402731 A1 | 12/2022 | Kobayashi | |

FOREIGN PATENT DOCUMENTS

| | | | |
|---|---|---|---|
| JP | 2017-154840 A | 9/2017 | |
| KR | 102302376 B1 * | 9/2021 | H01L 21/67259 |
| WO | 2020/121765 A1 | 6/2020 | |
| WO | 2021/100297 A1 | 5/2021 | |

\* cited by examiner

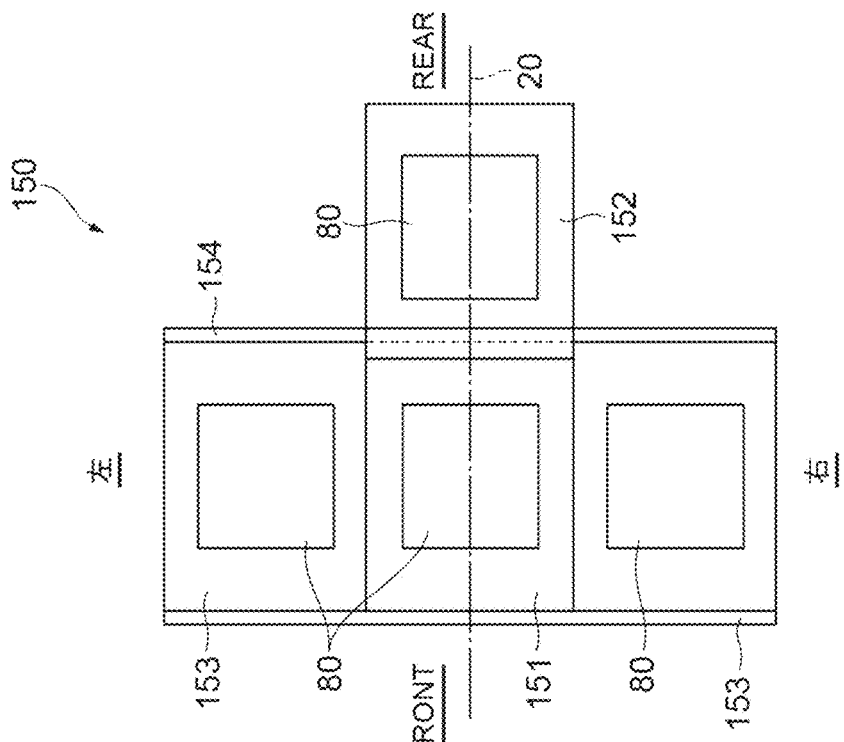
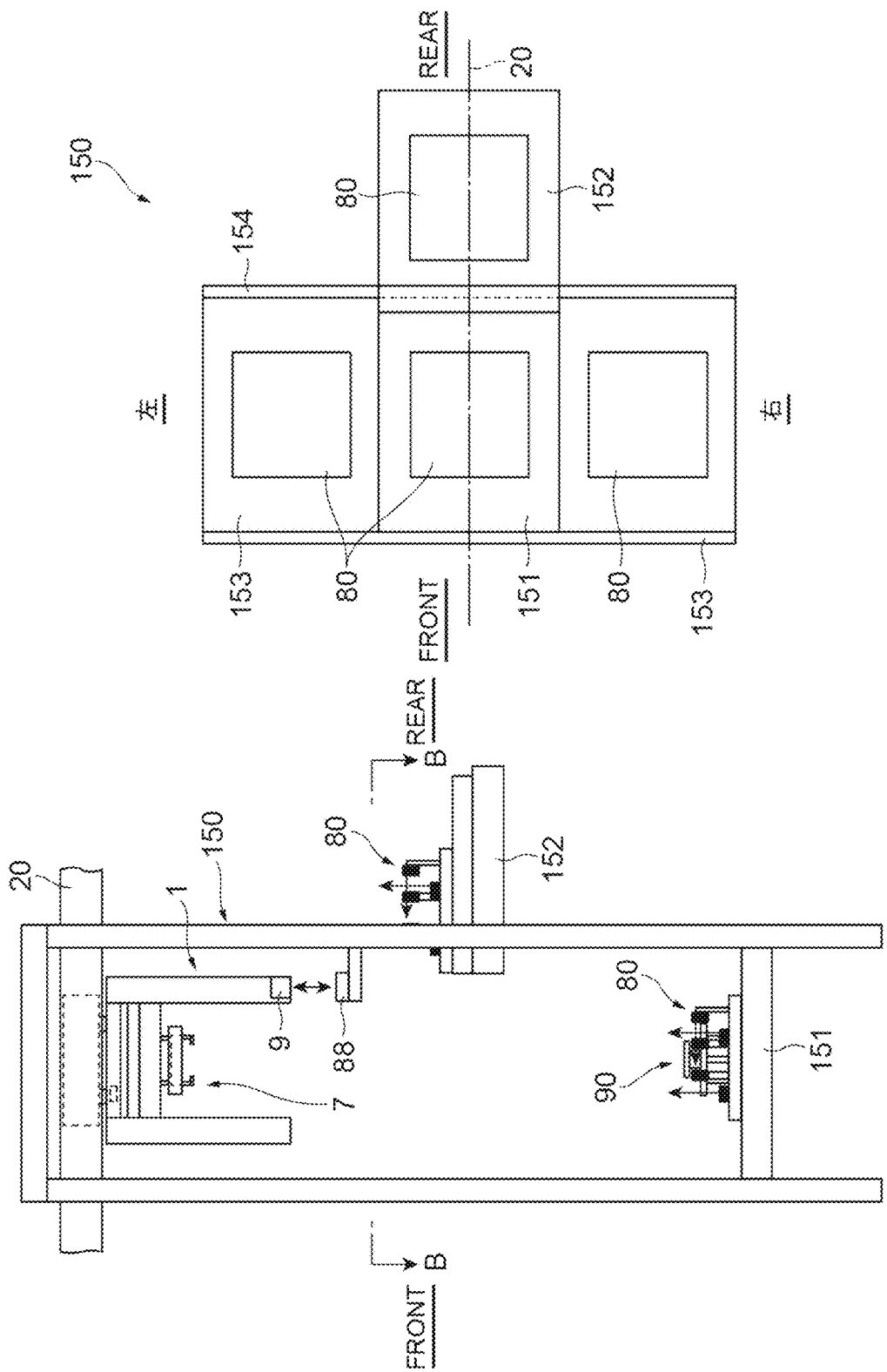

TRANSPORT VEHICLE SYSTEM

BACKGROUND OF THE INVENTION

1. Field of the Invention

One aspect of the present invention relates to a transport vehicle system.

2. Description of the Related Art

There is known an overhead transport vehicle in which a traveling part configured to travel on a track installed on a ceiling and the like and a lifting part including a gripping part configured to transfer an article to a transfer part such as a shelf or a load port are provided. The lifting part is suspended and held by a plurality of suspending members such as belts, and configured to be lifted and lowered by winding or paying out the suspending members. In such an overhead transport vehicle, the lifting part is required to be maintained in parallel with the transfer part (in a case in which the transfer part is horizontal, the lifting part is required to be horizontal) during lifting or lowering.

For example, Japanese Unexamined Patent Publication No. H10-194410 discloses an overhead transport vehicle in which fixed end positions of suspending members with respect to a drum and an unwinding angle of both suspending members extending from a winding surface of the drum are set so that accumulation of winding differences per rotation of the drum caused by deviation of timing when the two suspending members (lifting belts) that are double wound shift to winding of the next layer is smaller than a predetermined value with which the lifting part (placement table) can be held at a required horizontal degree. With this overhead transport vehicle, the winding difference between the two suspending members can be suppressed to fall within a permissible range, and the article can be horizontally gripped irrespective of a lifting position.

SUMMARY OF THE INVENTION

However, even if the winding difference between the two suspension members is kept within the permissible range by the above-described conventional method, the characteristics of each overhead transport vehicle (that is, machine differences) may possibly prevent the state of the lifting part from being appropriately adjusted during lifting and lowering.

Accordingly, preferred embodiments of the present invention provide transport vehicle systems in each of which a state of a lifter can be appropriately adjusted for each overhead transport vehicle without human intervention.

A transport vehicle system according to one aspect of a preferred embodiment of the present invention is a transport vehicle system including an overhead transport vehicle including a lifter including a gripper to grip an article and operable to be lifted and lowered by a plurality of suspenders, a measurer to measure a measurement target portion, a measured portion including the measurement target portion thereon, and a controller configured or programmed to cause the lifter to be lifted and lowered according to a predetermined set value, and the controller is configured or programmed to control lifting and lowering of the lifter so that the measurer is able to measure the measured portion by one of the measurer and the measured portion gripped by the gripper and by the other of the measurer at a predetermined position and the measured portion at a predetermined position, and correct the set value based on a result of measurement of the measured portion made by the measurer.

In the overhead transport vehicle, the lifter is controlled based on a predetermined set value when lifted or lowered, but in the transport vehicle system of a preferred embodiment of the present invention, the set value is appropriately corrected based on the measurement result acquired by the measured portion and the measurer (that is, information considered to be indicative of the current state of the lifter when the lifting part is lifted and lowered to a transfer portion). This makes it possible to appropriately adjust the state of the lifter for each overhead transport vehicle without human intervention.

In a transport vehicle system according to one aspect of a preferred embodiment of the present invention, one of the measurer and the measured portion may be a first unit grippable by the gripper, the other of the measurer and the measured portion may be a second unit placeable at the predetermined position, and one of the first unit and the second unit may be placed at the predetermined position in a state of being supported by the other of the first unit and the second unit. With this configuration, automatic measurement by the measurer and the measured portion can be executed rapidly.

A transport vehicle system according to one aspect of a preferred embodiment of the present invention may further include a communicator to transmit the result of measurement of the measured portion made by the measurer to the controller, and the measured portion may be used in a state of being gripped by the gripper and the measurer may be used in a state of being placed at the predetermined position. With this configuration, automatic measurement by the measurer and the measured portion is feasible without significantly changing the configuration of the overhead transport vehicle.

A transport vehicle system according to one aspect of a preferred embodiment of the present invention may further include a maintenance trestle that is provided in a traveling area of the overhead transport vehicle and on which a placement table to be the predetermined position is provided. With this configuration, separately from a placement portion, a position where automatic measurement by the measurer and the measured portion is enabled is provided, so that the overhead transport vehicle can be measured efficiently.

In an overhead transport vehicle system according to one aspect of a preferred embodiment of the present invention, the overhead transport vehicle may include a body arranged such that the lifter is able to be lifted and lowered with respect to the body by the suspenders being wound and unwound, and a slider to move the lifter in a direction perpendicular or substantially perpendicular to both a transport direction of the overhead transport vehicle and the vertical direction, and the maintenance trestle may include a first placement table provided at a position where the article is placeable by lowering the lifter without activating the slider, a second placement table provided above the first placement table in the vertical direction and provided to be retractable in a horizontal direction from an area above the first placement table in the vertical direction, and a third placement table provided at a position where the article is placeable by activating at least the slider. With this configuration, in each of the placement portion provided at a relatively low position with respect to the traveling position of the overhead transport vehicle, the placement portion provided at a relatively high position, and the placement portion on which placing is performed by activating the slider, the inclination of the lifter for each overhead transport vehicle can be appropriately adjusted.

In a transport vehicle system according to one aspect of a preferred embodiment of the present invention, the controller may cause the overhead transport vehicle to periodically move to the maintenance trestle and cause the measurer to measure the measured portion. With this configuration, periodic adjustments to the set value can be made.

In a transport vehicle system according to one aspect of a preferred embodiment of the present invention, the set value may be set for each placement portion for the article, one of the measurer and the measured portion may be used in a state of being gripped by the gripper, and the other of the measurer and the measured portion may be used in a state of being formed or placed on the placement portion to be a measurement target. With this configuration, an adjustment of the optimal set value for each placement portion can be made.

In a transport vehicle system according to one aspect of a preferred embodiment of the present invention, the overhead transport vehicle may include a winding drum to lift and lower the lifter by winding and unwinding the suspenders, at least one guide roller around which the suspenders unwound from the winding drum are wound, a body supporting the winding drum and the guide roller, at least one position adjuster to move a connection portion of the suspenders with the lifter in a lifting-and-lowering direction by moving a relative position of the guide roller with respect to the body, and a controller configured or programmed to control a movement of the guide roller by the at least one position adjuster based on information about inclination of the lifter, and the set value may include the information about inclination. With this configuration, the inclination of the lifter can be adjusted with a simple configuration.

According to preferred embodiments of the present invention, it is possible to appropriately adjust the state of the lifter for each overhead transport vehicle without human intervention.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 12A is a side view illustrating a maintenance trestle and FIG. 12B is a plan view illustrating the maintenance trestle viewed from direction B in FIG. 12A.

DETAILED DESCRIPTION OF THE PREFERRED EMBODIMENTS

Preferred embodiments of the present invention will be described in detail below with reference to the accompanying drawings. In the description of the drawings, the same elements are denoted by the same reference signs, and redundant descriptions are omitted.

Figure 8:
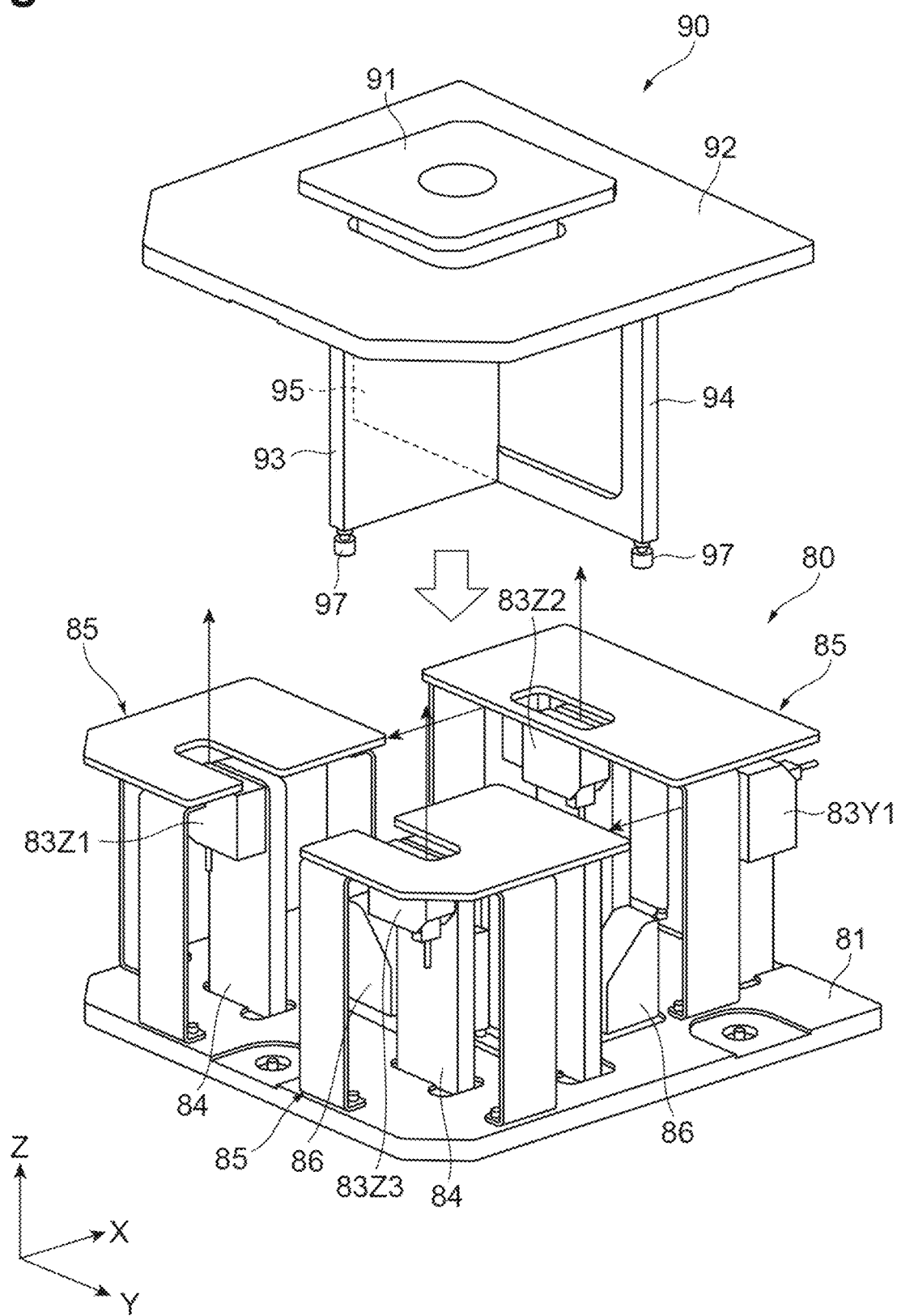
FIG. 8 is a perspective view of a measuring unit and a measured unit.

A transport vehicle system 100 according to a preferred embodiment includes a plurality of overhead transport vehicles 1 (see FIG. 1), a track 20 (see FIG. 1) defining a travel path for the overhead transport vehicles 1, an area controller 110 (see FIG. 11), a measuring unit (measurer) 80 (see FIG. 11), and a measured unit (measured portion) 90 (see FIG. 8). At least one of the overhead transport vehicles 1 includes a linear motion mechanism (position adjuster) 67 (see FIG. 4) configured to adjust the inclination of a holding unit (lifter) 7 with respect to the horizontal plane.

Figure 1:
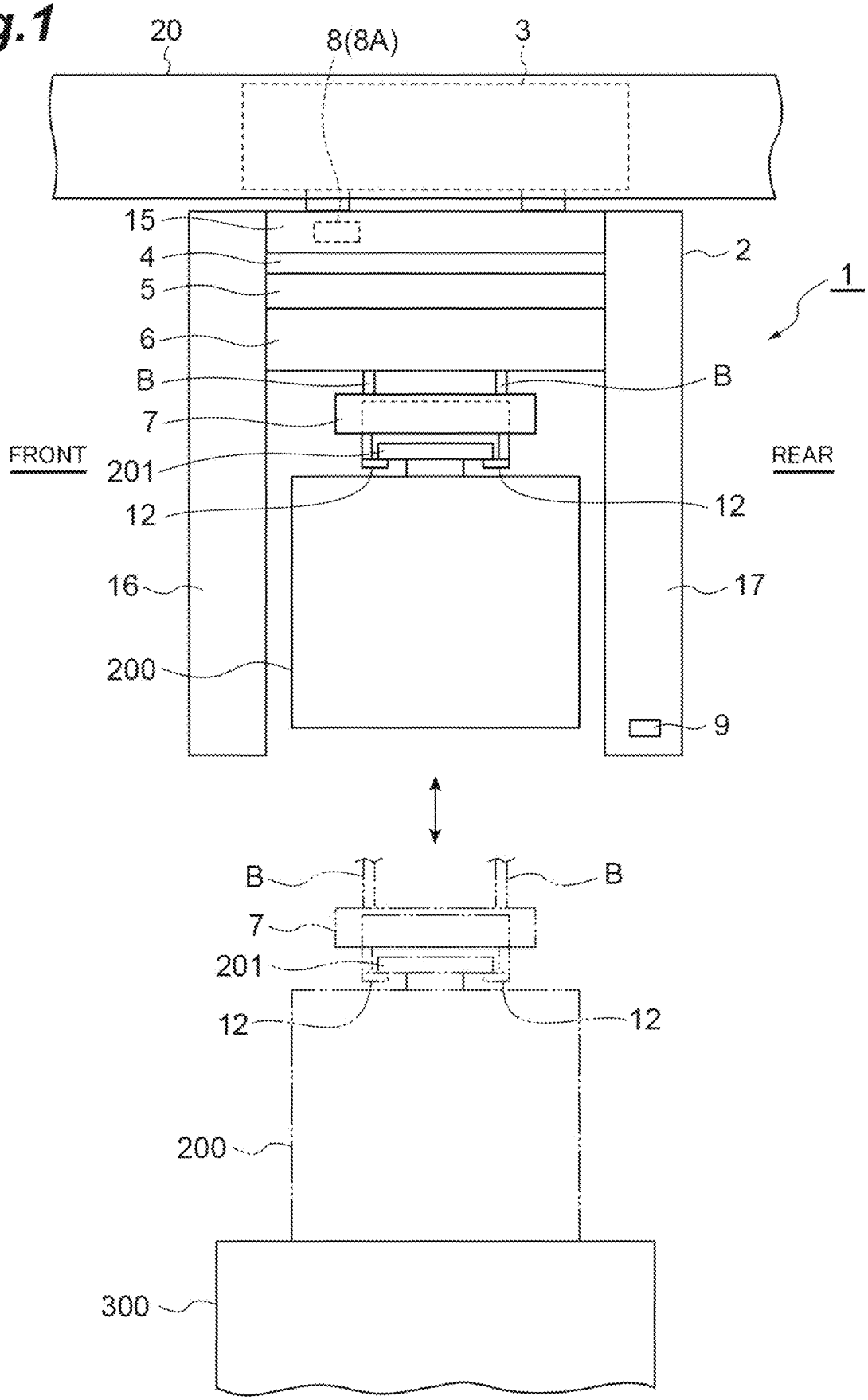
FIG. 1 is a side view of an overhead transport vehicle according to a preferred embodiment of the present invention.

As illustrated in FIG. 1, an overhead transport vehicle 1 according to the present preferred embodiment travels along the track 20 installed in the vicinity of a ceiling of a clean room in which semiconductor devices are manufactured. The overhead transport vehicle 1 according to the present preferred embodiment carries a front opening unified pod (FOUP) (article) 200 housing a plurality of semiconductor wafers, and transfers the FOUP 200 to a load port (transfer portion) 300 and the like provided on a processor device configured to perform various kinds of processing on the semiconductor wafers.

Figure 11:
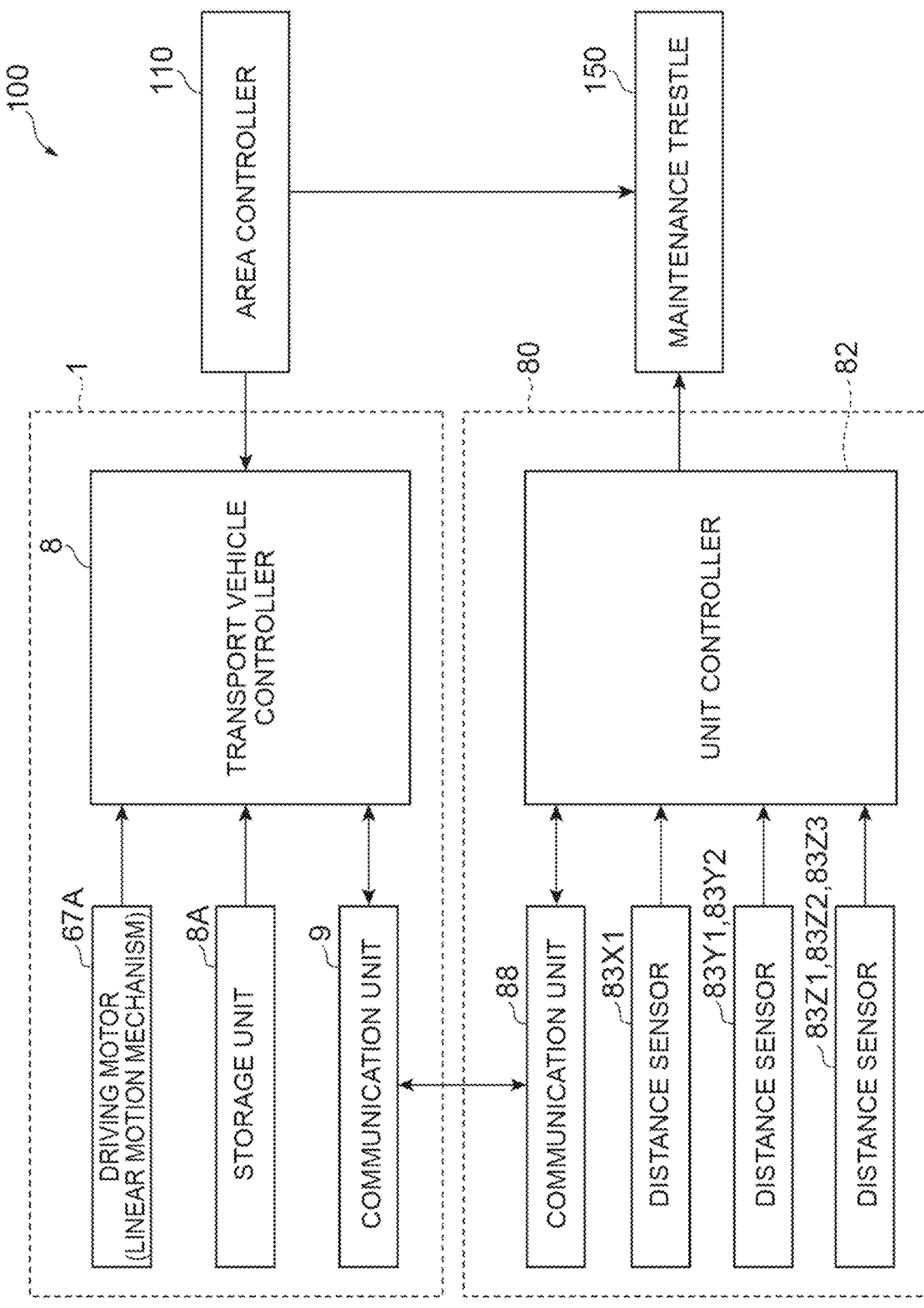
FIG. 11 is a block diagram illustrating a functional configuration of a transport vehicle system.

As illustrated in FIG. 1 and FIG. 11, the overhead transport vehicle 1 includes a frame unit 2, a traveling unit 3, a lateral unit 4, a theta unit 5, a lifting drive unit 6, a holding unit 7, a transport vehicle controller 8, a storage unit 8A, and a communication unit 9. The frame unit 2 includes a center frame 15, a front frame 16, and a rear frame 17. The front frame 16 extends downward from an end portion on a front side of the center frame 15 (front side in a traveling direction of the overhead transport vehicle 1). The rear frame 17 extends downward from an end portion on a rear side of the center frame 15 (rear side in the traveling direction of the overhead transport vehicle 1).

The traveling unit 3 is disposed on an upper side of the center frame 15. For example, the traveling unit 3 travels along the track 20 by receiving electric power supplied from a high-frequency current line installed along the track 20 in a non-contact manner. The lateral unit 4 is disposed on a lower side of the center frame 15. The lateral unit 4 causes the theta unit 5, the lifting drive unit 6, and the holding unit 7 to move in a lateral direction (a lateral side in the traveling direction of the overhead transport vehicle 1). The theta unit 5 is disposed on a lower side of the lateral unit 4. The theta unit 5 turns the lifting drive unit 6 and the holding unit 7 in a horizontal plane.

The lifting drive unit 6 is disposed on a lower side of the theta unit 5. The lifting drive unit 6 causes the holding unit 7 to be lifted and lowered. The holding unit 7 is disposed on a lower side of the lifting drive unit 6. The holding unit 7 holds a flange 201 of the FOUP 200.

The transport vehicle controller 8 is disposed in the center frame 15. The transport vehicle controller 8 is an electronic control unit including a central processing unit (CPU), read-only memory (ROM), random access memory (RAM), and the like. The transport vehicle controller 8 is configured or programmed to control respective parts of the overhead transport vehicle 1.

By way of example, the overhead transport vehicle 1 configured as described above operates as follows. In a case of transferring the FOUP 200 to the overhead transport vehicle 1 from the load port 300, the overhead transport vehicle 1 not holding the FOUP 200 stops at a predetermined position above the load port 300. If the position of the holding unit 7 that lowers at the stop position deviates from a predetermined position with respect to the load port 300 (FOUP 200 placed on the load port 300), the horizontal position and the horizontal angle of the holding unit 7 are adjusted by driving the lateral unit 4 and the theta unit 5. If the holding unit 7 lowered by paying out the belts (suspending members) B is inclined with respect to the horizontal plane, the inclination of the holding unit 7 is adjusted by activating the linear motion mechanism 67 (see FIG. 4).

The transport vehicle controller 8 performs, based on the set values stored in the storage unit 8A, adjustments of the horizontal position and horizontal angle of the holding unit 7 and the inclination of the holding unit 7. Subsequently, the lifting drive unit 6 lowers the holding unit 7, and the holding unit 7 holds the flange 201 of the FOUP 200 placed on the load port 300. Then, the lifting drive unit 6 lifts the holding unit 7 up to a lifting end, and disposes the FOUP 200 between the front frame 16 and the rear frame 17. Subsequently, the overhead transport vehicle 1 holding the FOUP 200 starts to travel.

Meanwhile, in a case of transferring the FOUP 200 from the overhead transport vehicle 1 to the load port 300, the overhead transport vehicle 1 holding the FOUP 200 stops at a predetermined position above the load port 300. If the position of the holding unit 7 (FOUP 200) to be lowered at the stop position deviates from the predetermined position with respect to the load port 300, the horizontal position and horizontal angle of the holding unit are adjusted by driving the lateral unit 4 and the theta unit 5. If the holding unit 7 lowered by paying out the belts B is inclined with respect to the horizontal plane, the inclination of the holding unit 7 is adjusted by activating the linear motion mechanism 67 (see FIG. 4).

The transport vehicle controller 8 performs, based on the set values stored in the storage unit 8A, adjustments of the horizontal position and horizontal angle of the holding unit 7 and the inclination of the holding unit 7. Subsequently, the lifting drive unit 6 lowers the holding unit 7, the FOUP 200 is placed on the load port 300, and the holding unit 7 releases the flange 201 of the FOUP 200. Then, the lifting drive unit 6 lifts the holding unit 7 up to the lifting end. Subsequently, the overhead transport vehicle 1 not holding the FOUP 200 starts to travel.

Figure 2:
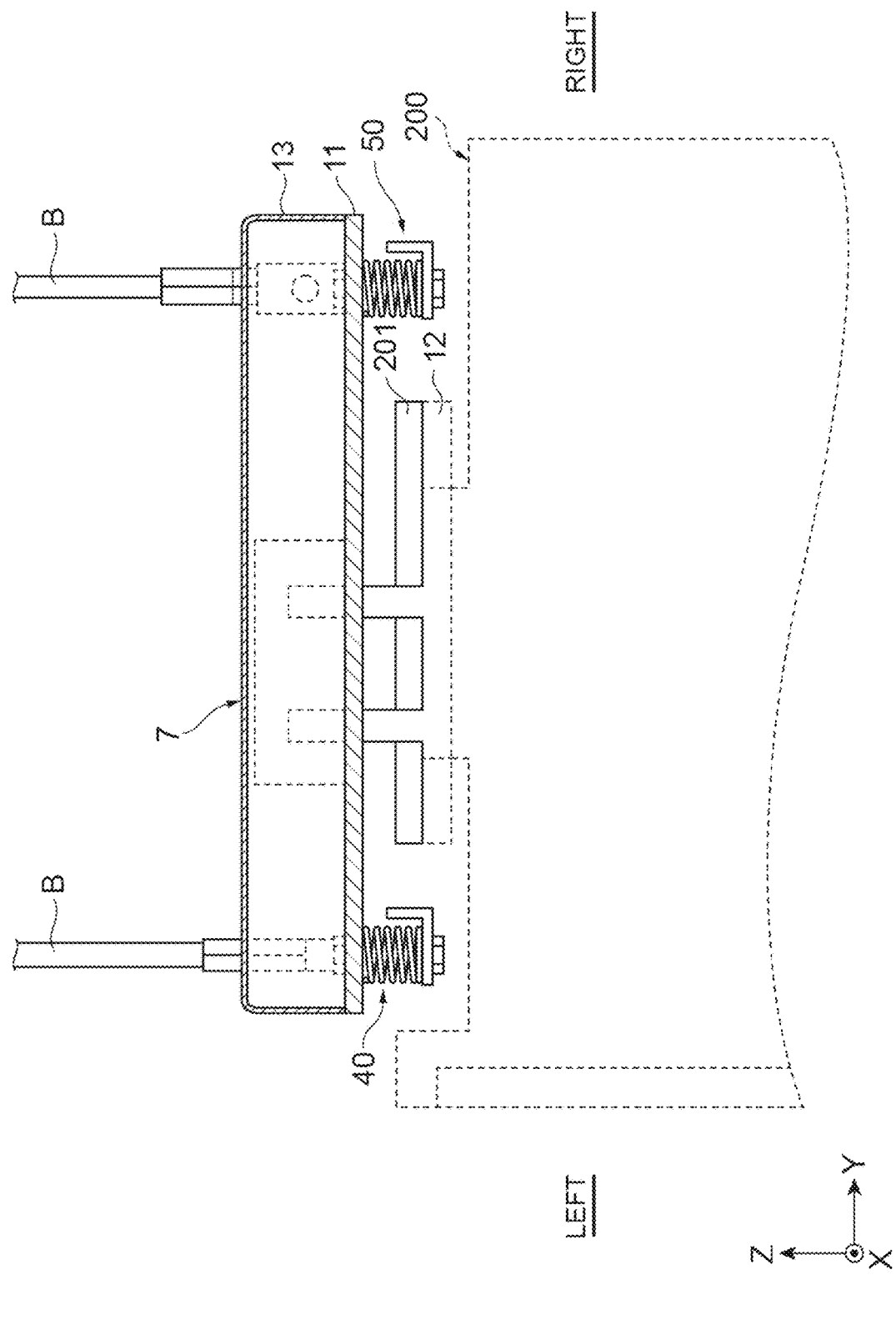
FIG. 2 is a front view of a holding unit.

Next, the following describes a configuration of the holding unit 7 in detail. As illustrated in FIG. 1 and FIG. 2, the holding unit 7 includes a base 11, a pair of grippers (gripping parts) 12 and 12, and a housing 13. The pair of grippers 12, 12 is supported by the base 11 so as to be openable and closeable along the horizontal direction. The pair of grippers 12, 12 is opened or closed by a driving motor (not illustrated) and a link mechanism (not illustrated). In the present preferred embodiment, the height position of the holding unit 7 is adjusted so that the holding surfaces of the grippers 12 are lower than the height of the lower surface of the flange 201 when the pair of grippers 12, 12 is in an opened state. In this state, as the pair of grippers 12, 12 is then in a closed state, the holding surfaces of the grippers 12 advance toward the lower surface of the flange 201, and as the lifting drive unit 6 is lifted in this state, the flange 201 is held (gripped) by the pair of grippers 12, 12 and the FOUP 200 is supported. In the holding unit 7, the base 11 constitutes a bottom wall of the housing 13, and the position thereof with respect to the housing 13 is fixed.

Figure 3:
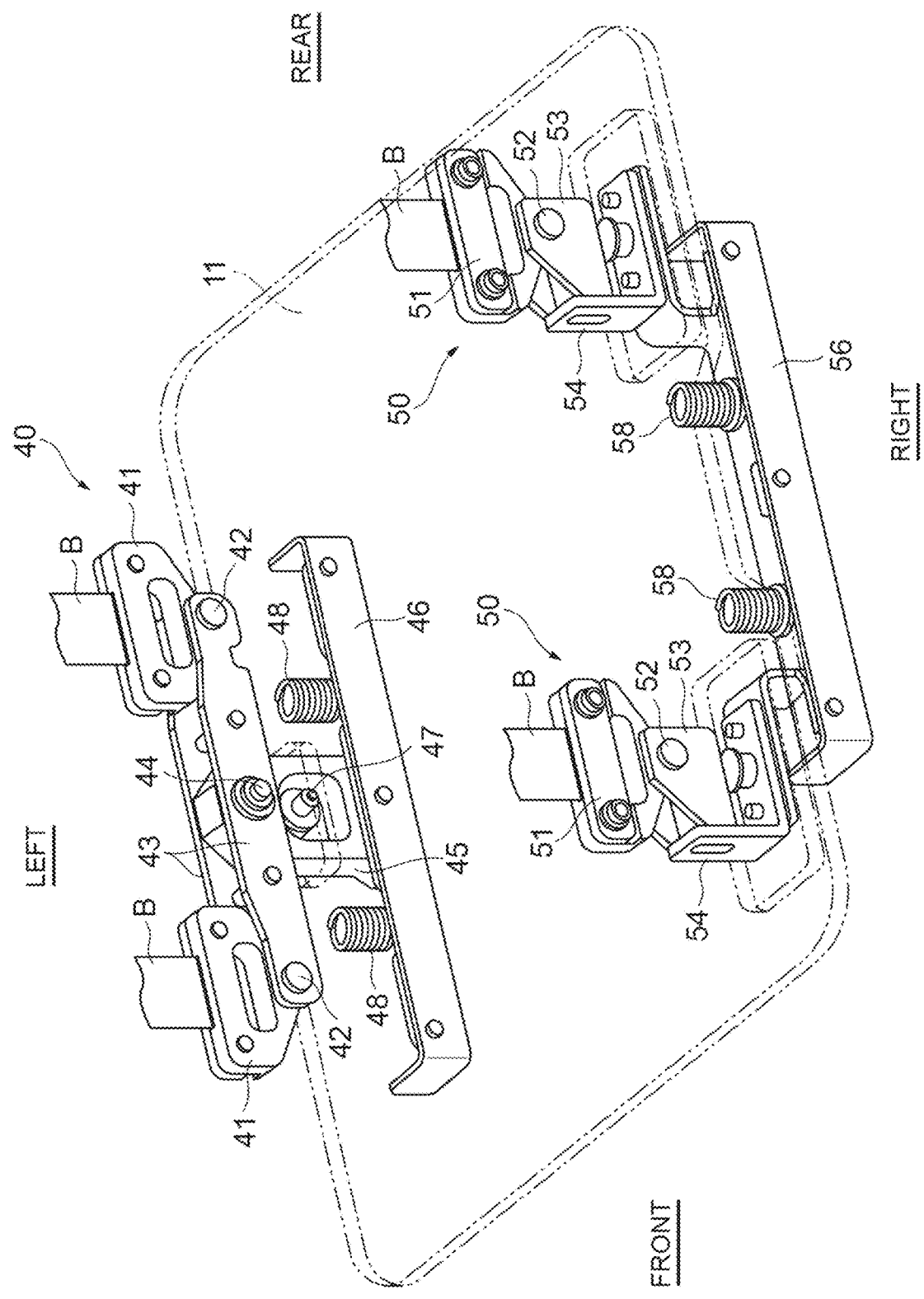
FIG. 3 is a perspective view of a first buffering mechanism and a second buffering mechanism.

As illustrated in FIG. 3, in the holding unit 7 of the present preferred embodiment, one ends of the belts B are connected via a first buffering mechanism 50 and a second buffering mechanism 40. The following describes the first buffering mechanism 50 and the second buffering mechanism 40 in detail. The first buffering mechanism 50 and the second buffering mechanism 40 are mechanisms configured to couple the belts B to the holding unit 7 (see FIG. 1), and are mechanisms configured to prevent vibration, which is caused when the traveling unit 3 travels or the holding unit 7 is lifted or lowered, from being transmitted to the FOUP 200.

The first buffering mechanism 50 includes elastic members 58 that support the base 11 to be movable vertically from below in the vertical direction, and is disposed on one side in the width direction orthogonal to the traveling direction of the overhead transport vehicle 1 in a plan view seen from the vertical direction. In the present preferred embodiment, the first buffering mechanism is provided on the right side of the holding unit 7 in the left-and-right direction. The first buffering mechanism 50 includes connection members 51, swing members 53, first body members 54, a second body member 56, and a pair of the elastic members 58, 58. The left-and-right direction in the present preferred embodiment means the left-and-right direction when the overhead transport vehicle 1 is viewed from the front in the traveling direction.

The connection member 51 is a member attached to the belt B. The swing member 53 is a member coupled to the connection member 51. The swing member 53 is coupled to the connection member 51 to be rotatable bidirectionally via a pin member 52. The first body member 54 is a substantially L-shaped member, and the bottom portion thereof is formed to be flat. The upper end of the first body member 54 is connected to the swing member 53. The bottom portion of the first body member 54 is connected to the second body member 56 by a bolt and the like. The second body member 56 supports the elastic members 58 from below and also supports the bottom portions of the first body members 54.

The pair of elastic members 58, 58 are coil springs each having a predetermined spring constant. The pair of elastic members 58, 58 are supported by the second body member 56 and support the base 11 from below. The lower end of the elastic member 58 is fixed to the second body member 56. The upper end of the elastic member 58 is not fixed to the base 11, but supports the base 11 in contact. That is, each of the pair of elastic members 58, 58 urges the second body member 56 and the base 11 in a direction to be away from each other, when in a contracted state being in contact with both the second body member 56 and the base 11. The elastic member 58 has the role of reducing vibration transmitted between the members being in contact with each other. It may be fixed to the base 11 and provided to be separable from and contactable to the second body member 56.

The second buffering mechanism 40 includes elastic members 48 that support the base 11 to be movable vertically from below in the vertical direction, and is disposed on the other side in the width direction (opposite side to the first buffering mechanism 50 in the width direction) that is orthogonal to the traveling direction of the overhead transport vehicle 1 in a plan view seen from the vertical direction. In the present preferred embodiment, the second buffering mechanism 40 is provided on the left side of the holding unit 7 in the left-and-right direction. The second buffering mechanism 40 includes connection members 41, 41, swing members 43, a third body member 45, a fourth body member 46, a restriction member 47, and a pair of elastic members 48, 48.

The connection members 41, 41 are members to which belts B, B are respectively attached. The swing member 43 is a member configured to couple the pair of connection members 41, 41 to the third body member 45. The pair of connection members 41, 41 and the swing members 43 are coupled to be bidirectionally rotatable and are coupled via a pair of pin members 42, 42. The swing members 43 and the third body member 45 are coupled to be bidirectionally rotatable via a pin member 44. The fourth body member 46 supports the elastic members 48, 48 from below.

The pair of elastic members 48, 48 are coil springs each having a predetermined spring constant. The pair of elastic members 48, 48 are supported by the fourth body member 46 and also support the base 11 from below. The lower end of the elastic member 48 is fixed to the fourth body member 46. The restriction member 47 restricts the base 11 from being separated from the fourth body member 46 by more than a predetermined distance. In more detail, the restriction member 47 locks the top surface of the base 11 that tries to move away from the fourth body member 46 by more than the predetermined distance. The upper end of the elastic member 48 is not fixed to the base 11, but supports the base 11 in contact. That is, each of the pair of elastic members 48, 48 urges the fourth body member 46 and the base 11 in the direction to be away from each other, when in a contracted state being in contact with both the fourth body member 46 and the base 11. The elastic member 48 has the role of reducing vibration transmitted between the members being in contact with each other. The elastic member 48 may be fixed to the base 11 and provided to be separable from and contactable to the fourth body member 46.

Although not illustrated, the holding unit 7 may be provided with a link mechanism that couples the first buffering mechanism 50 and the second buffering mechanism 40 and operates to make each of the distance between the first buffering mechanism 50 and the base 11 in the vertical direction and the distance between the second buffering mechanism 40 and the base 11 in the vertical direction closer together.

Figure 4:
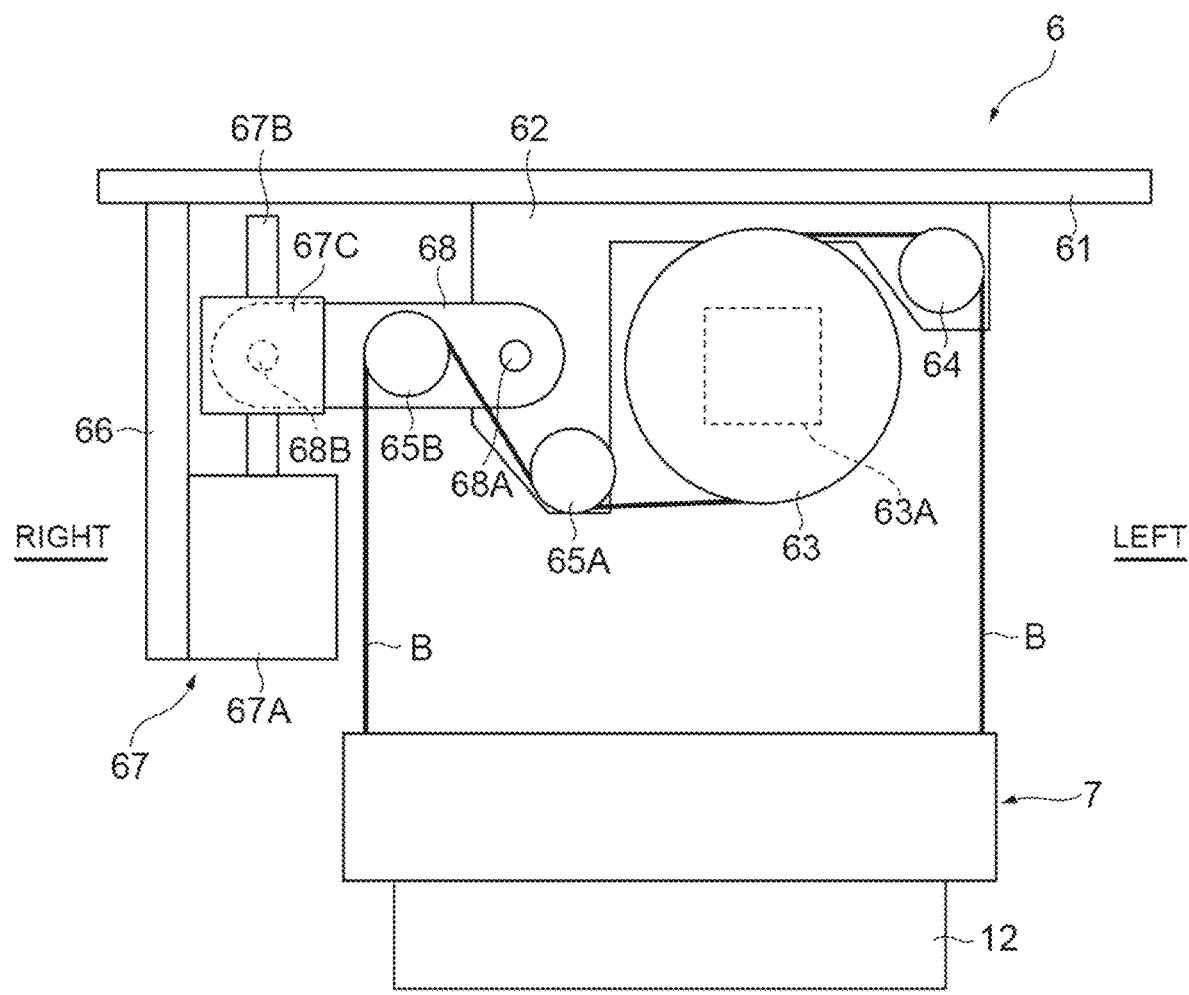
FIG. 4 is a front view of a lifting drive unit.
Figure 5:
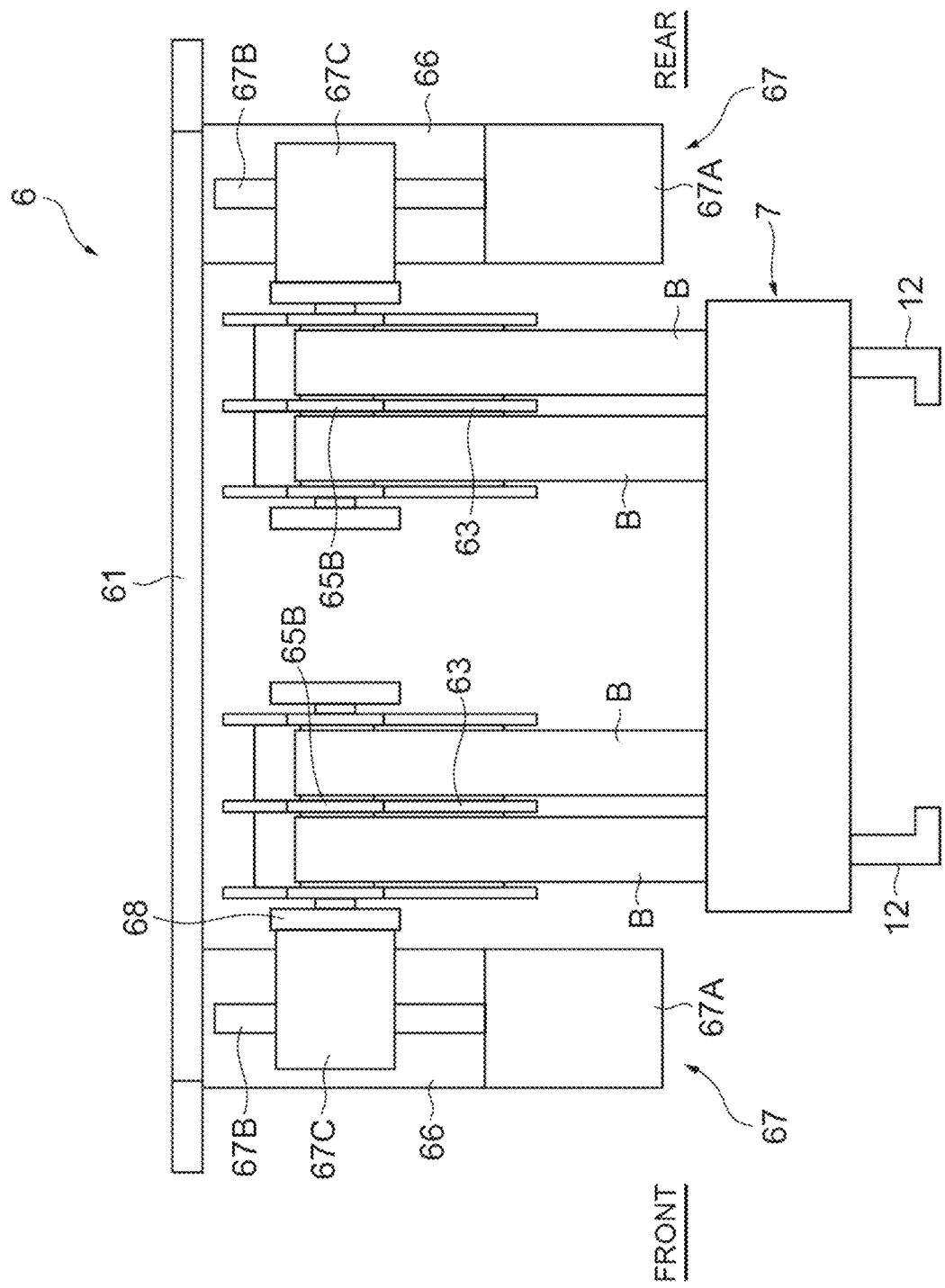
FIG. 5 is a side view of the lifting drive unit.

Next, the following describes a configuration of the lifting drive unit 6 in detail. As illustrated in FIG. 4 and FIG. 5, the lifting drive unit 6 includes a base (body) 61, a supporting part 62, four (a plurality of) winding drums 63, a driving motor (winding drive part) 63A, first idler rollers (guide rollers) 65A, second idler rollers (guide rollers) 65B, third idler rollers (guide rollers) 64, linear motion mechanisms (position adjusters) 67, swing members 68, and four (a plurality of) belts B.

The base 61 supports the winding drums 63, the first idler rollers 65A, and the third idler rollers 64 via the supporting part 62. The supporting part 62 supports the four winding drums 63 in a rotatable manner. The four winding drums 63 are arranged in the front and rear direction, and winds or pays out each of the four belts B by being driven by the driving motor 63A. The supporting part 62 supports the first idler roller 65A and one end part 68A of the swing member 68 in a swingable manner.

Each of the winding drums 63 is attached to the base 61 via the supporting part 62 in a rotatable manner. The driving motor 63A is a driving source to rotate each of the winding drums 63, and fixed to the base 61. The four winding drums 63 are driven by the one driving motor 63A by being attached to a common rotating shaft (not illustrated), or by being coupled to each other via an interlocking mechanism (not illustrated).

One end of each belt B is connected to the holding unit 7, and the other end of each belt B is connected to each winding drum 63. In the present preferred embodiment, the four belts B are provided to suspend three points of the holding unit 7. More specifically, the holding unit 7 is suspended by the four belts B. Two of the four belts B are connected to the one swing member 43 (refer to FIG. 3) that is provided in a swingable manner with respect to the holding unit 7 via the connection members 41, and the remaining two of the four belts are respectively connected to swing members 53 that are provided in a swingable manner with respect to the holding unit 7 via connection members 51.

The first idler roller 65A and the second idler roller guide movement of the belt B connected to the first buffering mechanism 50. The two belts B are connected to the first buffering mechanism 50, and the first idler roller 65A and the second idler roller 65B are provided corresponding to each of the belts B. The first idler roller 65A is provided on the supporting part 62, and does not move relatively to the base 61. The second idler roller is provided on the swing member 68 (described later), and moves relatively to the base 61. The configuration in which the second idler roller 65B moves relatively to the base 61 will be described at a latter stage. The third idler roller 64 guides movement of the belt B connected to the second buffering mechanism 40. The two belts B are connected to the second buffering mechanism 40, and the third idler roller 64 is provided corresponding to each of the belts B.

The linear motion mechanism 67 is a known mechanism mainly including a driving motor 67A, a screw shaft 67B, and a ball nut 67C, and configured to convert a rotational motion of the driving motor 67A into a linear motion. The linear motion mechanism 67 is fixed to the base 61 via a bracket 66. Another end part 68B of the swing member 68 is connected to the ball nut 67C in a swingable manner, the ball nut 67C configured to move along the screw shaft 67B by being driven by the driving motor 67A. In the present preferred embodiment, the swing member 68 swings when the ball nut 67C moves along the screw shaft 67B, and the second idler roller 65B moves relatively to the base 61 along with the swing of the swing member 68. In this way, the linear motion mechanism 67 moves the position of the second idler roller 65B so that a connection portion of the belt B (one end of the belt B) to the holding unit 7 (first buffering mechanism 50) moves in the lifting-and-lowering direction. The swing member 68 may be changed to a vertically movable member that is cantilevered by the linear motion mechanism 67, and by moving this member vertically, the position of the second idler roller 65B may be moved linearly.

Figure 6A:
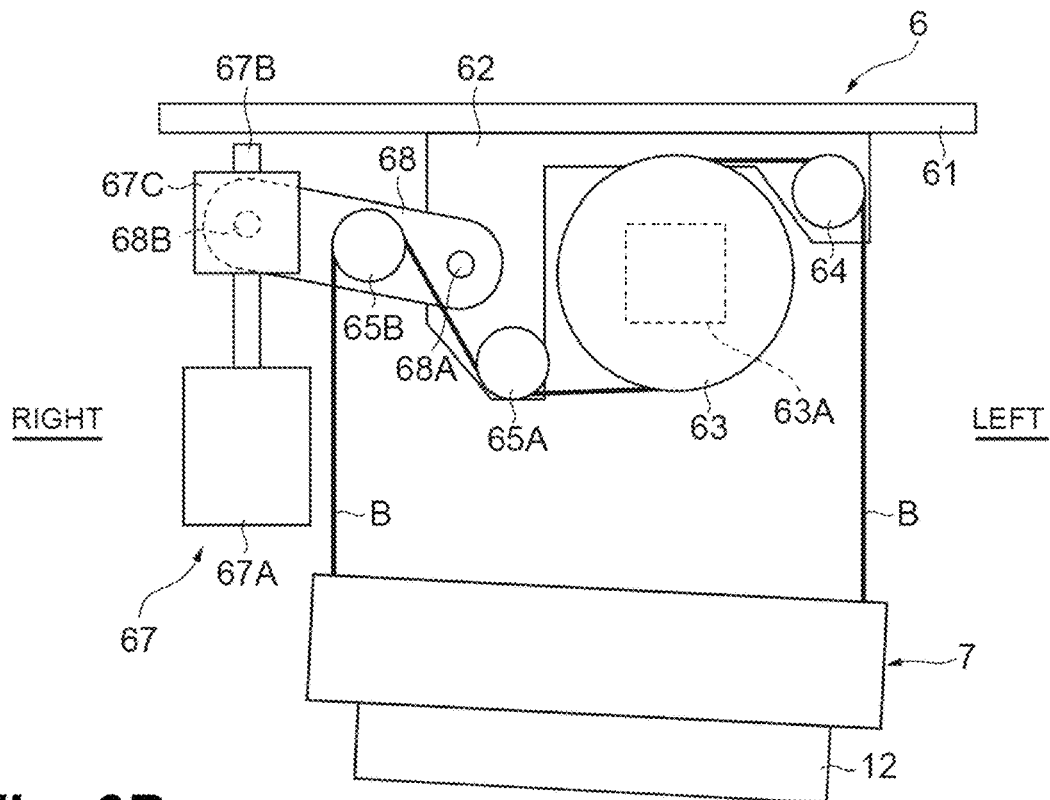
FIGS. 6A and 6B are front views illustrating the operation of the lifting drive unit.
Figure 6B:
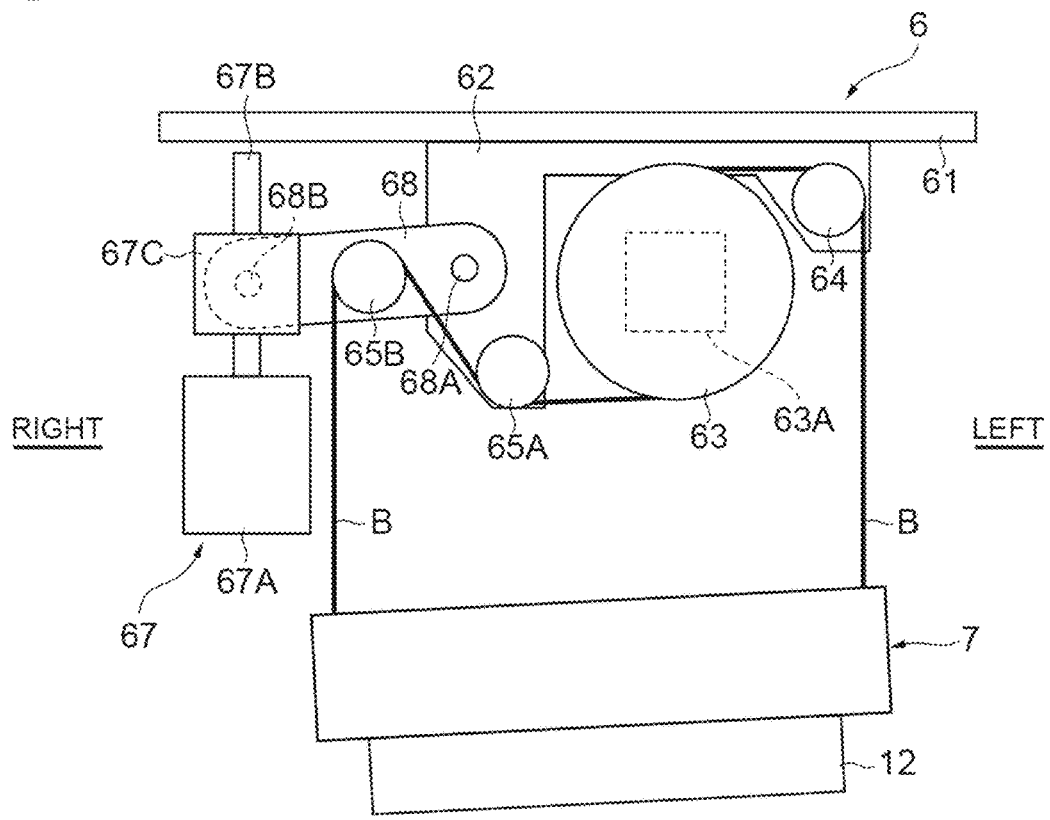

For example, as illustrated in FIG. 6A, when both the linear motion mechanisms 67 are activated and the second idler rollers 65B are moved upward (to be closer to the base 61), the right side of the holding unit 7 can be inclined upward. For example, as illustrated in FIG. 6B, when both the linear motion mechanisms 67 are activated and the second idler rollers 65B are moved downward (to be away from the base 61), the right side of the holding unit 7 can be inclined downward.

Figure 7A:
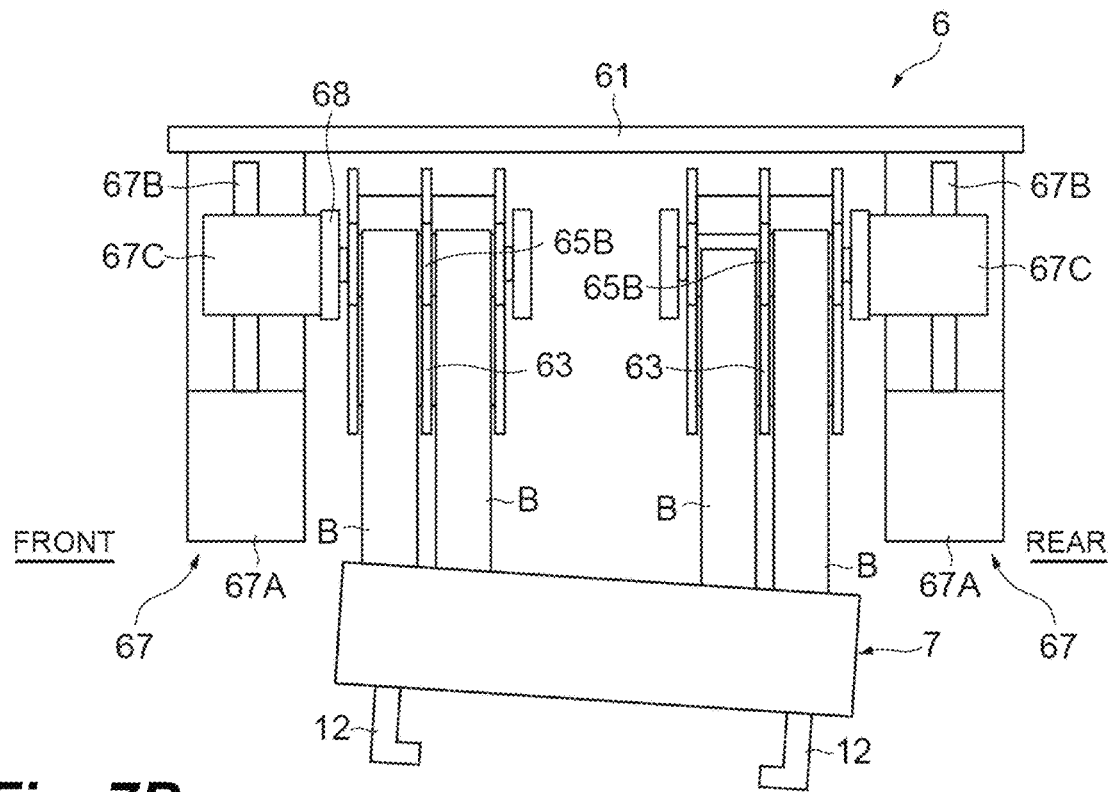
FIGS. 7A and 7B are side views illustrating the operation of the lifting drive unit.

For example, as illustrated in FIG. 7A, when one linear motion mechanism 67 (on the front side) of the two linear motion mechanisms 67 is activated and the second idler roller 65B is moved upward (to be closer to the base 61), the front side of the holding unit 7 can be inclined upward. In a case in which the front side of the holding unit 7 is desired to be inclined upward, the other linear motion mechanism 67 (on the rear side) of the two linear motion mechanisms 67 may be activated, and the second idler roller may be moved downward (to be away from the base 61).

Figure 7B:
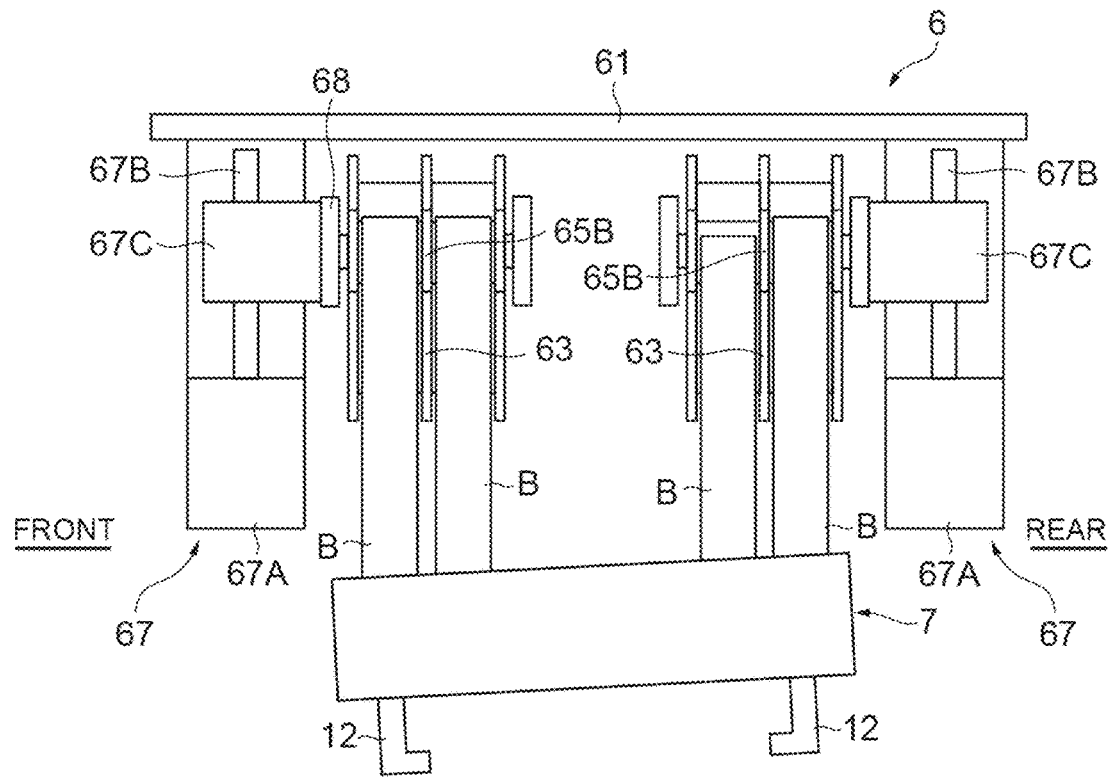

For example, as illustrated in FIG. 7B, when the other linear motion mechanism 67 (on the rear side) of the two linear motion mechanisms 67 is activated and the second idler roller 65B is moved upward (to be closer to the base 61), the rear side of the holding unit 7 can be inclined upward. In a case in which the rear side of the holding unit 7 is desired to be inclined upward, one linear motion mechanism 67 (on the front side) of the two linear motion mechanisms 67 may be activated, and the second idler roller may be moved downward (to be away from the base 61).

As in the foregoing, the overhead transport vehicle 1 of the present preferred embodiment can adjust, by activating both or one of the two linear motion mechanisms 67, the inclination of the holding unit 7 with respect to the horizontal plane. Furthermore, in the overhead transport vehicle 1 of the present preferred embodiment, the operation of the linear motion mechanism 67 is controlled based on the state of the overhead transport vehicle 1 (information on inclination of the lifting part). The state of the overhead transport vehicle 1 is stored, for example, in the storage unit 8A provided in the center frame 15. The state of the overhead transport vehicle 1 includes the state of the overhead transport vehicle 1 acquired during teaching and the state of the overhead transport vehicle 1 acquired by the measuring unit 80 and the measured unit 90.

On each of the overhead transport vehicles 1, teaching is performed before the transport vehicle system 100 is put into operation. The teaching causes the overhead transport vehicle 1 store the operation to be performed such that, in order for the overhead transport vehicle 1 to transfer the FOUP 200 at the load port 300, the state of the overhead transport vehicle 1 is acquired in a state in which the overhead transfer transport 1 is stopped at a predetermined position on the track 20 and the holding unit 7 is lowered by a predetermined distance to know an amount of deviation of the position of the holding unit 7 (more precisely, the position of the grippers 12) from a target position, and based on the state of the relevant overhead transport vehicle 1, the deviation from the target position falls within an allowable range when the transport vehicle system 100 is in operation. Examples of the state of the overhead transport vehicle 1 include information such as the actual position (X coordinate, Y coordinate, Z coordinate) of the grippers 12 with the reference position of the load port 300 as the origin, the angle θ, the angle αx, the angle αy, and the like.

Figure 9:
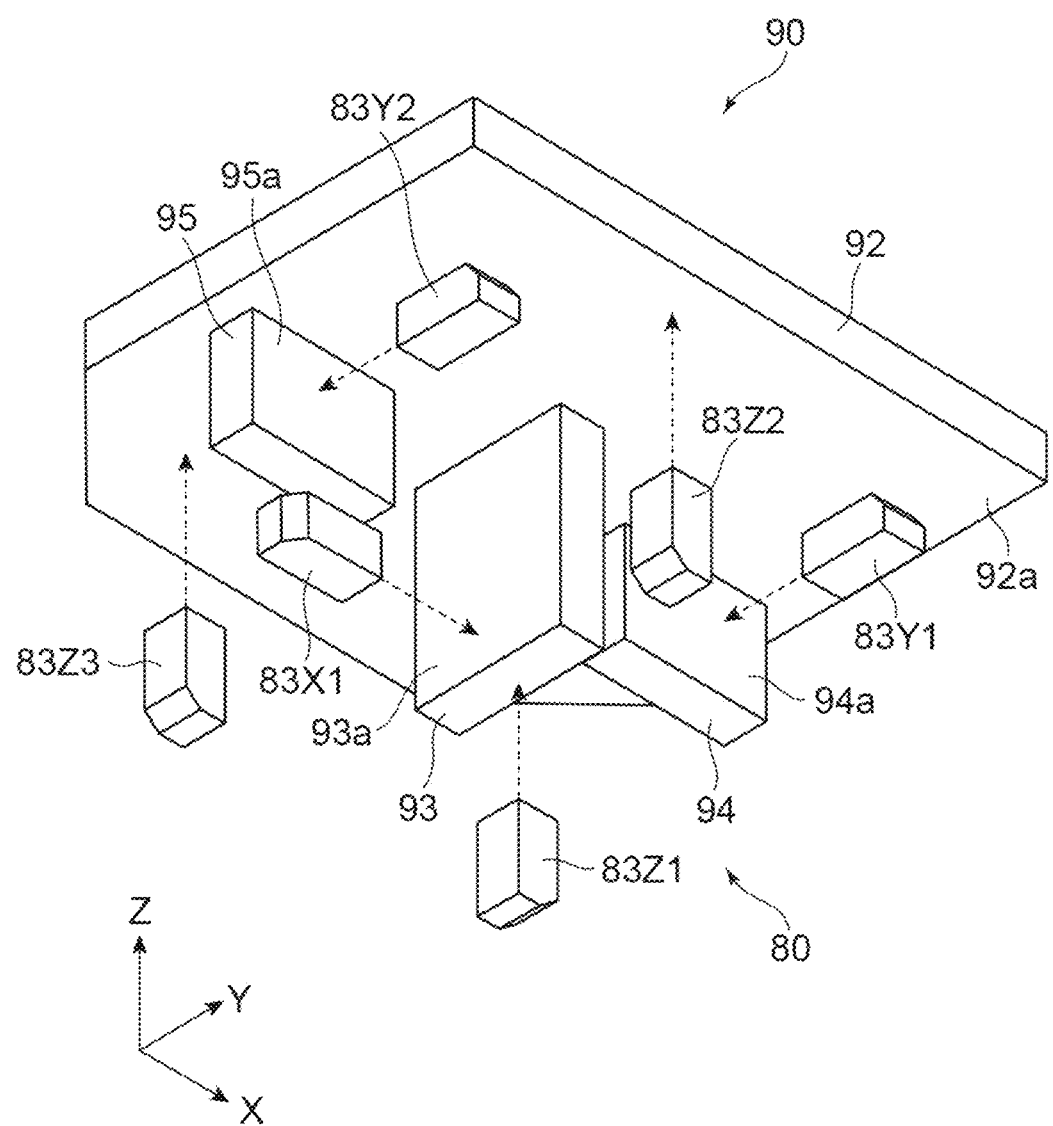
FIG. 9 is a schematic diagram illustrating measurement targets of each distance sensor when the measuring unit measures the measured unit.

The measuring unit 80 and the measured unit 90 are described in detail. As illustrated in FIG. 8 and FIG. 9, the measuring unit 80 and the measured unit 90 are units to acquire the state of the overhead transport vehicle 1 without human intervention. FIG. 8 is a perspective view of the measuring unit 80 and the measured unit 90, and FIG. 9 is a schematic diagram illustrating the measurement target of each distance sensor 83X1, 83Y1, 83Y2, 83Z1, 83Z2, 83Z3 when the measuring unit 80 measures the measured unit 90. The solid line arrows and broken line arrows illustrated in FIG. 8 and FIG. 9 indicate the output directions of the laser at each distance sensor 83X1, 83Y1, 83Y2, 83Z1, 83Z2, and 83Z3.

In the transport vehicle system 100 of the present preferred embodiment, when acquiring the state of the overhead transport vehicle 1, the unit measured unit 90 is mounted on the overhead transport vehicle 1 and the measuring unit 80 is mounted on the load port 300. That is, the measured unit (first unit member) 90 is used by being gripped by the pair of grippers 12, 12 and the measuring unit (second unit member) 80 is used by being placed on the load port 300. In a state in which the overhead transport vehicle 1 is stopped at a predetermined position on the track 20, the holding unit 7 is lowered by a predetermined distance, and the measured unit 90 is separated from the measuring unit 80 above the load port 300, the state of the overhead transport vehicle 1 is acquired.

The measuring unit 80 includes a body part 81, a unit controller 82 (see FIG. 11), a plurality of distance sensors 83X1, 83Y1, 83Y2, 83Z1, 83Z2, and 83Z3, mounting parts 84, support parts 85, and guide parts 86. The body part 81 is a flat plate-like member that supports the unit controller 82, the mounting parts 84, and the guide parts 86. The unit controller 82 is provided in a state of being supported by the body part 81 and performs various electrical processes in the measuring unit 80.

Each of the distance sensors 83X1, 83Y1, 83Y2, 83Z1, 83Z2, and 83Z3 is a laser-type distance sensor, for example, and is attached to the mounting parts 84. The distance sensor 83X1 measures the distance to an object by emitting a laser beam toward the inside of the body part 81 along the X-axis direction. The distance sensors 83Y1 and 83Y2 measure the distances to an object by emitting laser beams toward the inside of the body part 81 along the Y-axis direction. The distance sensors 83Z1, 83Z2, and 83Z3 measure the distances to an object by emitting laser beams upward along the Z-axis direction.

The mounting parts 84 are the portions on which each of the distance sensors 83X1, 83Y1, 83Y2, 83Z1, 83Z2, and 83Z3 is mounted, and are provided to stand on the body part 81. The support parts 85 are the portions that support the measured unit 90 and are provided to stand on the body part 81. The guide parts 86 are the portions that guide so that the measured unit 90 is positioned in a predetermined position when the measured unit 90 is supported on the support parts 85. The guide parts 86 are provided to stand on the body part 81.

The measured unit 90 has a flange 91, a base plate 92, a plurality of target plates 93, 94, and 95, and legs 97. The flange 91 is the portion provided grippable by the gripper 12. The base plate 92 is connected to the flange 91, and the target plates 93, 94, and 95 are provided to stand thereon. The base plate 92 and the target plates 93, 94, and 95 are the portions forming the target surfaces to be measured by the respective distance sensors 83X1, 83Y1, 83Y2, 83Z1, 83Z2, and 83Z3.

Each target plate 93, 94, and 95 is fixed in a predetermined place on the base plate 92. A surface 93a facing the distance sensor 83X1 in the target plate 93 is a plane perpendicular to the X-axis direction and has a predetermined positional relation with the reference position of the load port 300 (center position of the placement surface of the load port 300). A surface 94a facing the distance sensor 83Y1 in the target plate 94 and a surface facing the distance sensor 83Y2 in the target plate 95 are planes perpendicular to the Y-axis direction and have a predetermined positional relation with the reference position of the load port 300. The legs 97 are provided at the bottom of each of the target plates 93, 94, and 95, and come into contact with the body part 81 of the measuring unit 80 when the measured unit is supported by the measuring unit 80.

As in the foregoing, the unit controller 82 of the measuring unit 80 can acquire the measurement distance X1 by the distance sensor 83X1, the measurement distance Y1 by the distance sensor 83Y1, the measurement distance Y2 by the distance sensor 83Y2, the measurement distance Z1 by the distance sensor 83Z1, the measurement distance Z2 by the distance sensor 83Z2, and the measurement distance Z3 by the distance sensor 83Z3. Then, the unit controller 82 can, based on a plurality of measurement distances X1, Y1, Y2, Z1, Z2, and Z3, calculate the actual position (X coordinate, Y coordinate, Z coordinate) of the grippers 12 with the reference position of the load port 300 as the origin, and the angle θ, the angle αx, and the angle αy.

Figure 10A:
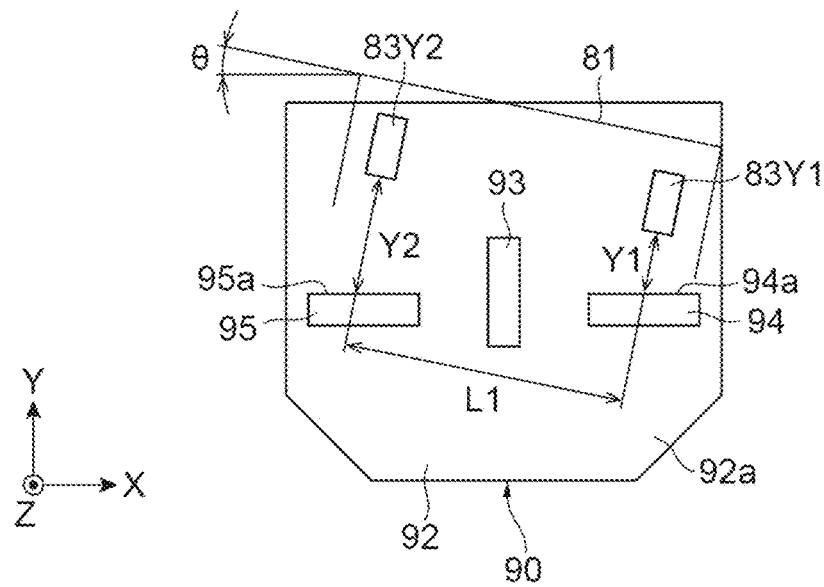
FIGS. 10A to 10C are schematic diagrams illustrating a method in which a unit controller calculates the state of the overhead transport vehicle.

In this case, as illustrated in FIG. 10A, the angle θ is the rotation angle of the measuring unit 80 rotating about the Z-axis with respect to the measured unit 90 (that is, the rotation angle of the gripper 12 rotating about the Z-axis with respect to the load port 300). Assuming that the distance between the distance sensor 83Y1 and the distance sensor 83Y2 is L1, the angle θ is expressed as $\theta=\tan^{-1}[(Y1-Y2)/L1]$. In FIG. 10A, depiction of the distance sensors 83X1, 83Z1, 83Z2, 83Z3, and the like is omitted.

Figure 10B:
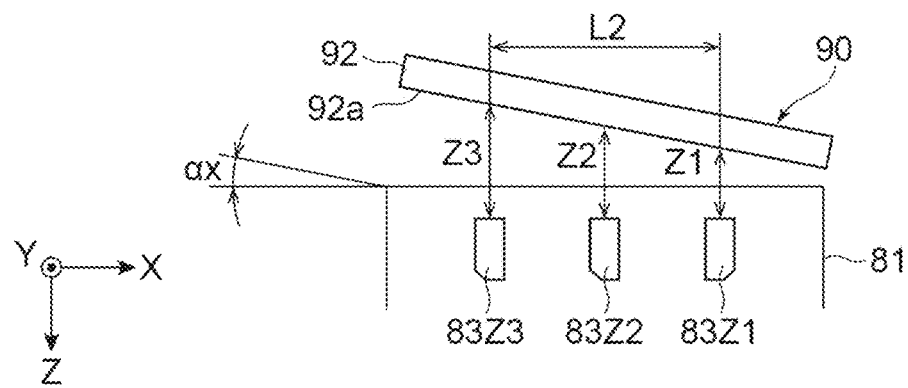

The angle αx, as illustrated in FIG. 10B, is the tilt angle of the measuring unit 80 inclined about the Y-axis with respect to a surface 92a of the base plate 92 of the measured unit (that is, the tilt angle of the gripper 12 inclined about the Y-axis with respect to the reference plane of the load port 300). Assuming that the distance between the distance sensor 83Z1 and the distance sensor 83Z3 is L2, the angle αx is expressed as $\alpha x=\tan^{-1}[(Z3-Z1)/L2]$. In FIG. 10B, depiction of the distance sensors 83X1, 83Y1, and 83Y2 and the target plates 93, 94, 95, and the like is omitted.

Figure 10C:
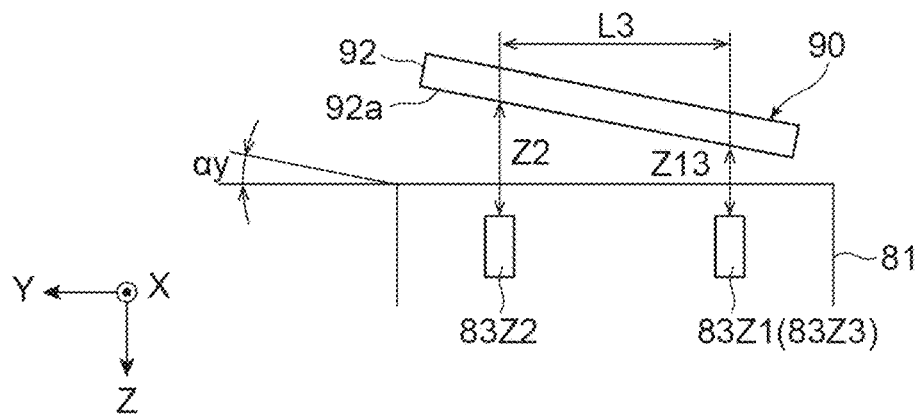

The angle αy, as illustrated in FIG. 10C, is the tilt angle of the measuring unit 80 inclined about the X-axis with respect to the surface 92a of the base plate 92 of the measured unit 90 (that is, the tilt angle of the gripper 12 inclined about the X-axis with respect to the reference plane of the load port 300). Assuming that the average value of the distance Z1 measured by the distance sensor 83Z1 and the distance Z3 measured by the distance sensor 83Z3 (that is, $(Z1+Z3)/2$) is Z13 and that the distance between the line connecting the distance sensor 83Z1 and the distance sensor 83Z3 and the distance sensor 83Z2 is L3, the angle αy is expressed as $\alpha y=\tan^{-1}[(Z2-Z13)/L3]$. In FIG. 10C, depiction of the distance sensors 83X1, 83Y1, and 83Y2 and the target plates 93, 94, 95, and the like is omitted.

In the transport vehicle system 100 of the present preferred embodiment, at a predetermined load port 300, in place of acquiring the actual position (X coordinate, Y coordinate, Z coordinate) of the grippers 12 with the reference position of the load port 300 as the origin, the angle θ, the angle αx, and the angle αy (hereinafter, also referred to simply as the "state of the overhead transport vehicle 1"), the state of the overhead transport vehicle 1 is acquired using the measuring units 80 placed on a first placement table 151, a second placement table 152, and a pair of third placement tables 153, 153 provided on a maintenance trestle 150 illustrated in FIGS. 12A and 12B and using at least one measured unit 90.

Next, the maintenance trestle 150 is described in detail. As illustrated in FIG. 12A, the maintenance trestle 150 is provided at a predetermined position along the track 20. The first placement table 151, the second placement table 152, and the pair of third placement tables 153, 153 are supported by a frame 154. The first placement table 151 is provided below the track 20 and at a relatively low position with respect to the second placement table 152 (in other words, at a position where the unwound amount of belts B for placing the FOUP 200 is relatively large).

The second placement table 152 is provided below the track 20 and at a relatively high position with respect to the first placement table 151 (in other words, at a position where the unwound amount of belts B for placing the FOUP 200 is relatively small). The second placement table 152 is provided at a position displaced from the first placement table 151 (in the present preferred embodiment, at a position displaced toward the rear) in a plan view seen from above in the vertical direction. The second placement table 152 is provided to be slidable in the front-and-rear direction and is provided to be movable between an advanced position at which it is located in the area above the first placement table 151 and a retracted position at which it is not located in the area above the first placement table 151. When the state of the overhead transport vehicle 1 is acquired using the second placement table 152, the second placement table 152 is moved to the advanced position.

The pair of third placement tables 153, 153 are disposed so as to sandwich the track 20 in a plan view seen from above. The pair of third placement tables 153, 153 are provided at a position where the FOUP 200 cannot be transferred without activating the lateral unit 4. The pair of third placement tables 153, 153 are fixed immovably, unlike the second placement table 152.

As in the foregoing, with the maintenance trestle 150 including the first placement table 151, the second placement table 152, and the pair of third placement tables 153, 153, the state of the overhead transport vehicle 1 can be acquired for each of the first placement table 151, the second placement table 152, and the pair of third placement tables 153, 153. That is, on the maintenance trestle 150, the state of the overhead transport vehicle 1 when the unwound amount of belts B is relatively large can be acquired using the first placement table 151, the state of the overhead transport vehicle 1 when the unwound amount of belts B is relatively small can be acquired using the second placement table 152, and the state of the overhead transport vehicle 1 when the belts B are unwound by activating the lateral unit 4 can be acquired using the pair of third placement tables 153, 153.

Figure 13A:
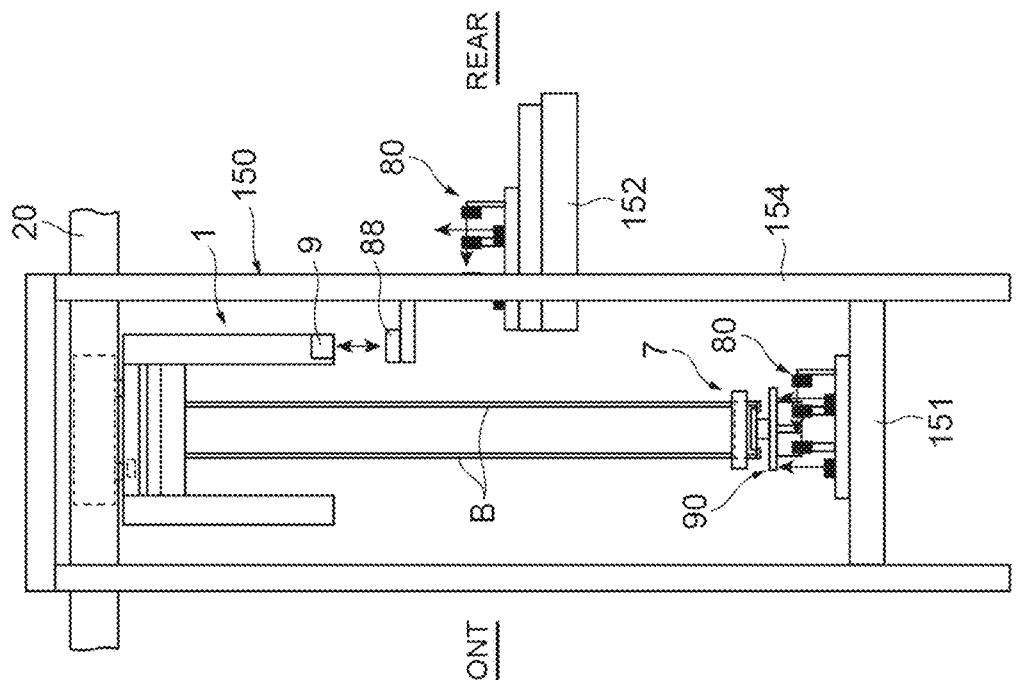
FIGS. 13A and 13B are diagrams for explaining the procedure for acquiring the state of the overhead transport vehicle using the maintenance trestle.

Next, using the maintenance trestle 150, a flow of acquiring the state of the overhead transport vehicle 1 is described. As illustrated in FIG. 13A, the area controller 110 causes the overhead transport vehicle 1 to move to the maintenance trestle 150 with predetermined timing. The area controller 110 (see FIG. 11) causes the overhead transport vehicle 1 to move to the maintenance trestle 150 according to a predetermined schedule (periodically). On the first placement table 151 of the maintenance trestle 150, the measured unit 90 is placed in a state of being supported by the measuring unit 80 (see FIG. 8).

Figure 13B:
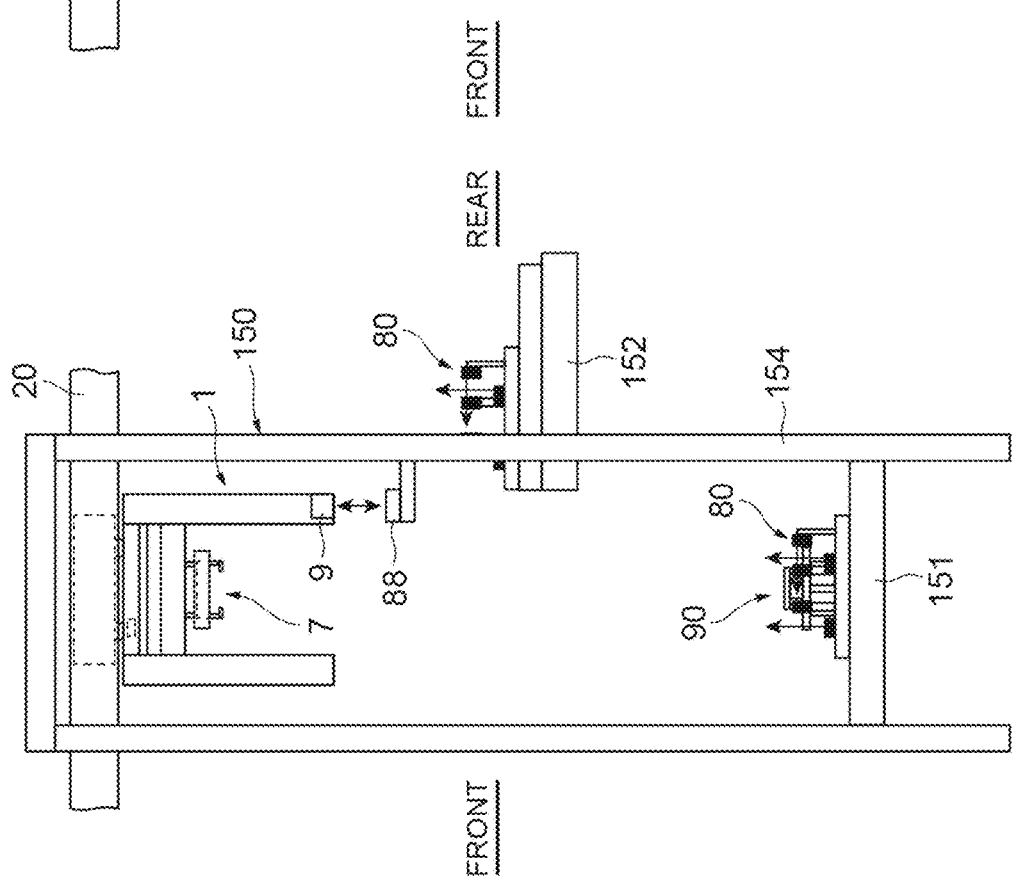

As illustrated in FIG. 13B, the overhead transport vehicle 1 unwinds the belts B in a state of stopping above the first placement table 151 and lowers the holding unit 7. After unwinding the belts B by a predetermined amount, the overhead transport vehicle 1 activates the grippers 12 to grip the flange 91 of the measured unit 90. Thereafter, a predetermined amount of belts B is rewound and the measured unit 90 supported by the measuring unit 80 is separated from the measuring unit 80. The measuring unit 80 placed on the first placement table 151 measures, in this state, the distances X1, Y1, Y2, Z1, Z2, and Z3 to the base plate 92 and the target plates 93, 94, and 95 of the measured unit 90.

Figure 14A:
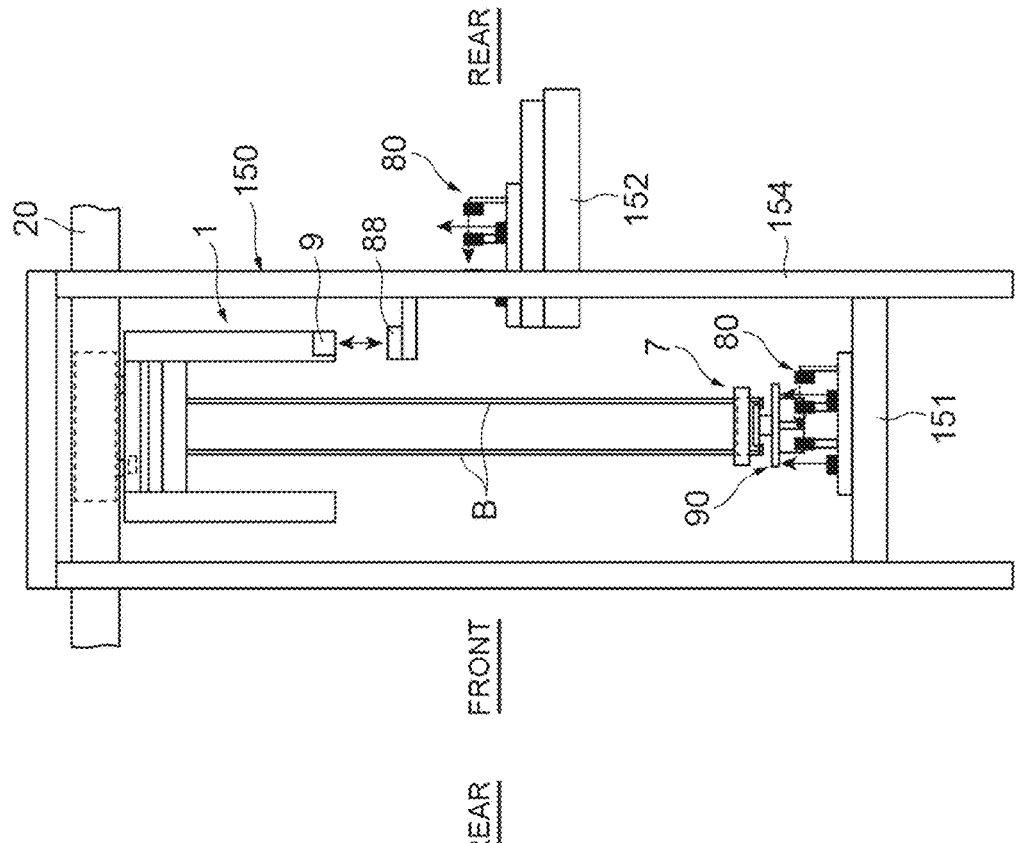
FIGS. 14A and 14B are diagrams for explaining the procedure for acquiring the state of the overhead transport vehicle using the maintenance trestle.

After the measurement by the measuring unit 80 placed on the first placement table 151, the overhead transport vehicle 1 winds the belts B in a state of gripping the measured unit 90, and moves the holding unit 7 to a height position higher than the second placement table 152. Next, as illustrated in FIG. 14A, the second placement table 152 is slid and moved to the advanced position above the first placement table 151. The overhead transport vehicle 1 unwinds the belts B and lowers the holding unit 7 holding the measured unit 90. The overhead transport vehicle 1 unwinds the belts B by a predetermined amount and positions the measured unit 90 so as to be in a state of being separated by a predetermined amount from the measuring unit 80 placed on the second placement table 152. The measuring unit 80 placed on the second placement table 152 measures, in this state, the distances X1, Y1, Y2, Z1, Z2, and Z3 to the base plate 92 and the target plates 93, 94, and of the measured unit 90.

After the measurement by the measuring unit 80 placed on the second placement table 152, the overhead transport vehicle 1 winds the belts B in a state of gripping the measured unit 90, and then, activates the lateral unit 4 to move the holding unit 7 above one of the pair of third placement tables 153. The overhead transport vehicle 1 unwinds the belts B and lowers the holding unit 7 holding the measured unit 90. The overhead transport vehicle 1 unwinds the belt B by a predetermined amount and positions the measured unit 90 so as to be in a state of being separated by a predetermined amount from the measuring unit 80 placed on the one of the pair of third placement tables 153. The measuring unit 80 placed on the one of the pair of third placement tables 153 measures, in this state, the distances X1, Y1, Y2, Z1, Z2, and Z3 to the base plate 92 and the target plates 93, 94, and 95 of the measured unit 90.

After the measurement by the measuring unit 80 placed on the one of the pair of third placement tables 153, the overhead transport vehicle 1 winds the belts B in a state of gripping the measured unit 90, activates the lateral unit 4, and this time, moves the holding unit 7 above the other of the pair of third placement tables 153. The overhead transport vehicle 1 unwinds the belts B and lowers the holding unit 7 holding the measured unit 90. The overhead transport vehicle 1 unwinds the belts B by a predetermined amount and positions the measured unit 90 so as to be in a state of being separated by a predetermined amount from the measuring unit 80 placed on the other of the pair of third placement tables 153. The measuring unit 80 placed on the other of the pair of third placement tables 153 measures, in this state, the distances X1, Y1, Y2, Z1, Z2, and Z3 to the base plate 92 and the target plates 93, 94, and 95 of the measured unit 90.

Figure 14B:
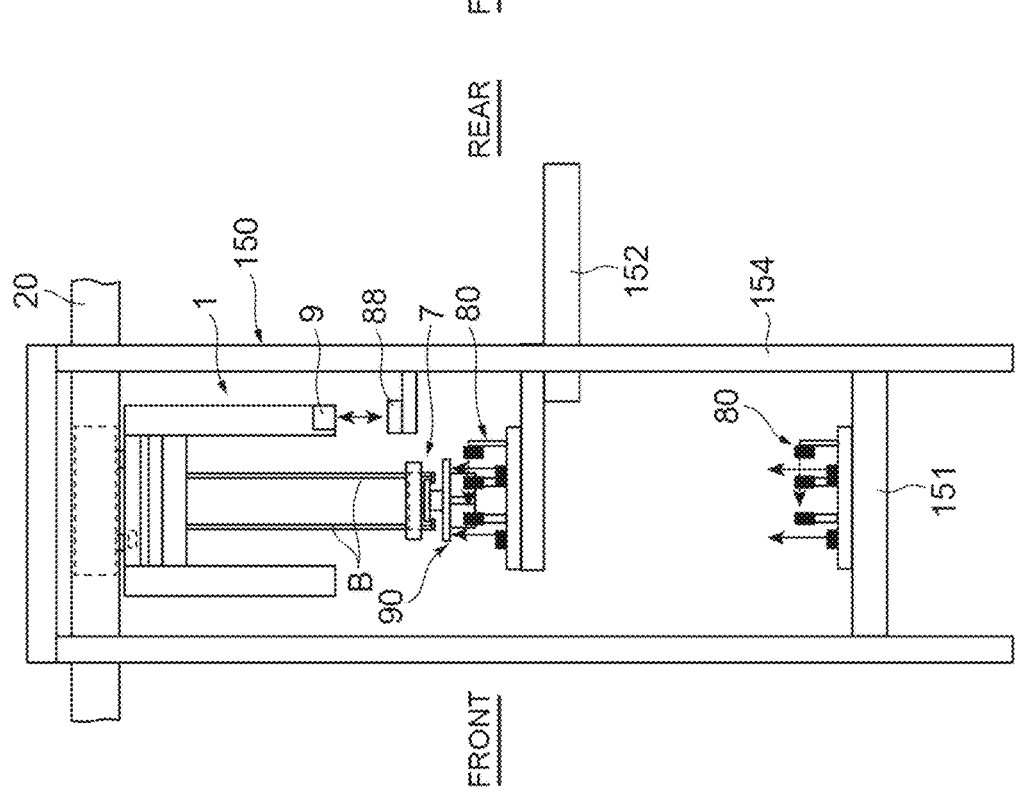

After the measurement by the measuring unit 80 placed on the other of the pair of third placement tables 153, the overhead transport vehicle 1 winds the belts B in a state of gripping the measured unit 90, activates the lateral unit 4, and this time, moves the holding unit 7 above the first placement table 151. Next, as illustrated in FIG. 14B, the second placement table 152 moves to the retracted position retracted from above the first placement table 151. The move to the retracted position of the second placement table 152 may be performed at an appropriate timing after the measurement by the measuring unit 80 placed on the second placement table 152.

Figure 15:
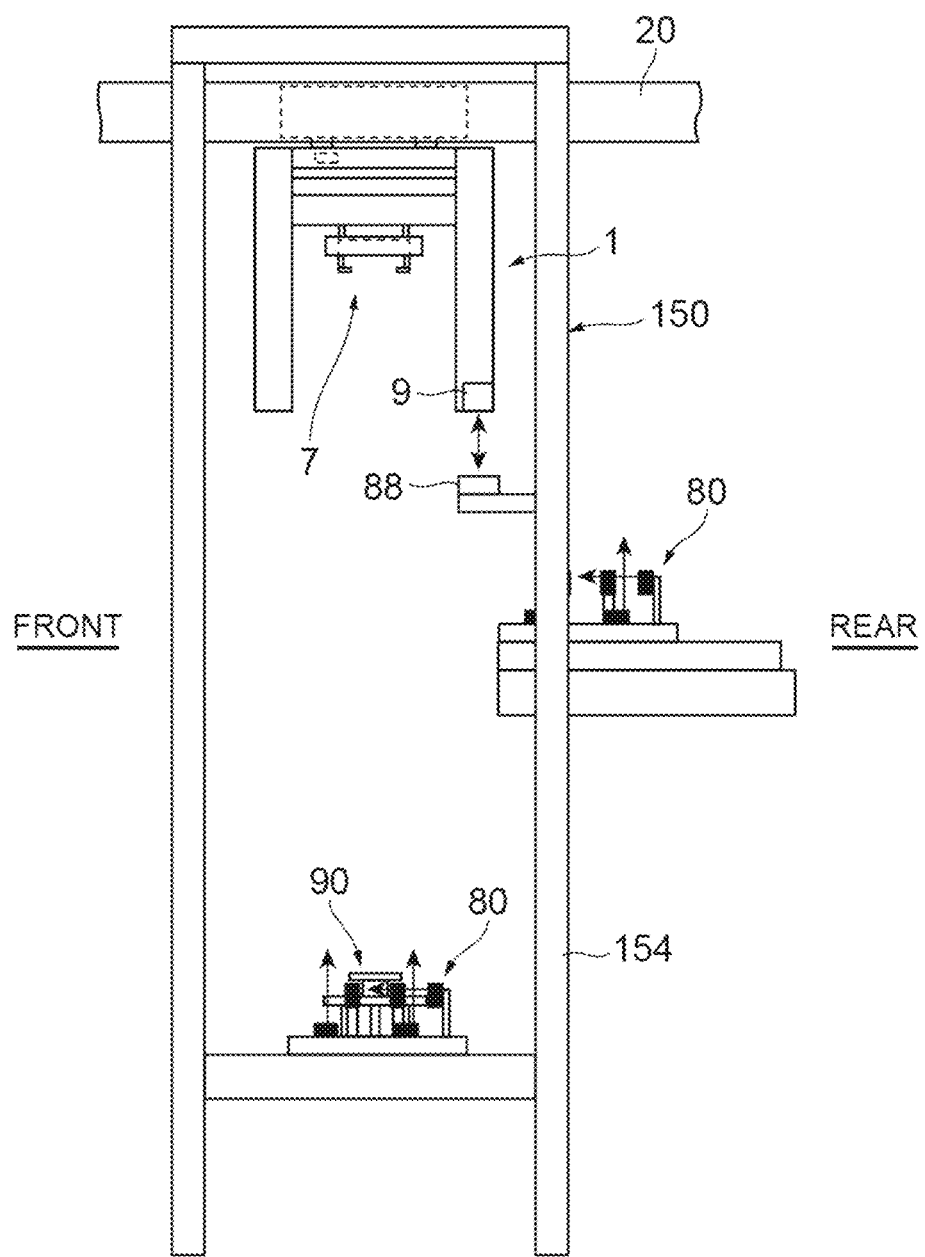
FIG. 15 is a diagram for explaining the procedure for acquiring the state of the overhead transport vehicle using the maintenance trestle.

The overhead transport vehicle 1 unwinds the belts B in a state of stopping above the first placement table 151 and lowers the holding unit 7 holding the measured unit 90. As illustrated in FIG. 15, the overhead transport vehicle 1 unwinds the belts B until the measured unit 90 is in a state of being supported by the measuring unit 80 placed on the first placement table 151, then activates the grippers 12 to release the gripping of the flange 91 of the measured unit 90. The measured unit 90 is in a state of being supported by the measuring unit 80 placed on the first placement table 151. Thereafter, the overhead transport vehicle 1 winds the belts B until the holding unit 7 is ready to travel. The area controller 110 causes the overhead transport vehicle 1 to leave from the maintenance trestle 150.

By the foregoing flow, on each of the measured unit 90 placed on each of the first placement table 151, the second placement table 152, and the pair of third placement tables 153, 153 at which the distances X1, Y1, Y2, Z1, Z2, and Z3 to the base plate 92 and the target plates 93, 94, and 95 have been measured, information such as the actual position (X coordinate, Y coordinate, Z coordinate) of the grippers 12 with the reference position of each of the placement tables as the origin, the angle θ, the angle αx, and the angle αy is calculated based on the distances X1, Y1, Y2, Z1, Z2, and Z3. These pieces of information are transmitted to the communication unit 9 of the overhead transport vehicle 1 via a communication unit 88 provided in the maintenance trestle 150. The communication unit 88 of the maintenance trestle 150 and the communication unit 9 of the overhead transport vehicle 1 can perform communication by various methods and devices such as optical communication, wireless communication, and the like.

The transport vehicle controller 8 causes the storage unit 8A (see FIG. 11) to store the information received via the communication unit 9 such as the actual position (X coordinate, Y coordinate, Z coordinate) of the grippers 12 with the reference position of each placement table as the origin, the angle θ, the angle αx, and the angle αy. That is, the transport vehicle controller 8 causes the storage unit 8A to store (update) the latest state of the overhead transport vehicle 1 acquired by the measuring unit 80 and the measured unit 90. The transport vehicle controller 8 controls the operation of the linear motion mechanisms 67 based on the state of the overhead transport vehicle 1 stored in this storage unit 8A.

The action and effect in the transport vehicle system 100 of the above-described preferred embodiment are described. In such a transport vehicle system 100, the holding unit 7 is controlled based on predetermined set values when lifted or lowered, but in the transport vehicle system 100 of the above-described preferred embodiment, the set values are appropriately corrected based on the measurement result acquired by the measuring unit 80 and the measured unit 90, that is, the information that is considered to be indicative of the current state of the holding unit 7 when the holding unit 7 is lifted or lowered to the transfer part, for example, the load port 300. This makes it possible to appropriately adjust the inclination of the holding unit 7 for each overhead transport vehicle 1 without human intervention In the transport vehicle system 100 of the above-described preferred embodiment, the measured unit 90 is formed as a unit member grippable by the grippers 12, and the measuring unit is formed as a unit member placeable on each of the placement tables of the maintenance trestle 150. When the overhead transport vehicle 1 is about to start acquiring the state of the overhead transport vehicle 1, the measured unit 90 is placed on the first placement table 151 in a state of being supported by the measuring unit 80. This makes it possible to rapidly execute automatic measurement by the measuring unit 80 and the measured unit 90.

In the transport vehicle system 100 of the above-described preferred embodiment, the measured unit 90 is used in a state of being gripped by the grippers 12, and the measuring unit is used in a state of being placed on each of the placement tables of the maintenance trestle 150. This makes it possible to perform automatic measurement by the measuring unit 80 and the measured unit 90 without significantly changing the configuration of the overhead transport vehicle 1.

In the transport vehicle system 100 of the above-described preferred embodiment, the maintenance trestle 150 is provided in the traveling area of the overhead transport vehicle 1 separately from the load port 300, so that the overhead transport vehicle 1 can be measured efficiently without stopping the operation by the transport vehicle system 100.

In the transport vehicle system 100 of the above-described preferred embodiment, the maintenance trestle 150 including the first placement table 151, the second placement table 152, and the third placement tables 153 is provided, so that, on each of the load port 300 provided at a relatively low position with respect to the traveling position of the overhead transport vehicle 1, the load port 300 provided at a relatively high position, and the load port 300 on which placing is performed by operating the sliding part, it is possible to appropriately adjust the inclination of the holding unit 7 for each overhead transport vehicle 1.

In the transport vehicle system 100 of the above-described preferred embodiment, the overhead transport vehicle 1 is periodically moved to the maintenance trestle 150 and the measuring unit 80 is made to measure the measured unit 90, so that periodic adjustment of the set values can be made.

In the overhead transport vehicle 1 of the above-described preferred embodiment, by activating the linear motion mechanisms 67, the inclination of the holding unit 7 with respect to the horizontal plane can be adjusted. The amount of operation of the linear motion mechanisms 67 (amount of movement of the guide rollers) is automatically adjusted based on the information about the inclination on the holding unit 7 (information such as the angle $\alpha x$ and the angle $\alpha y$) that is the state of the overhead transport vehicle 1, so that the holding unit 7 can be adjusted to the desired tilt. That is, the overhead transport vehicle 1 of the present preferred embodiment can appropriately adjust the inclination of the holding unit 7 without human intervention.

The preferred embodiments have been described above, but the present invention is not limited to the preferred embodiments described above. Various modifications can be made without departing from the gist of the present invention.

First Modification

In the overhead transport vehicle 1 of the above-described preferred embodiments, it has been described with an example of acquiring the state of the overhead transport vehicle 1 by causing the overhead transport vehicle 1 to enter the maintenance trestle 150, but the state of the overhead transport vehicle 1 may be acquired for each load port 300 of the transport vehicle system 100. With this configuration, the holding unit 7 can be adjusted to the optimum inclination for each load port 300 on which the FOUP 200 is actually placed.

Second Modification

In the overhead transport vehicle 1 of the above-described preferred embodiments and the above-described modification, it has been described with an example of acquiring the state of the overhead transport vehicle 1 from the measuring unit 80 and the measured unit 90 when the holding unit 7 grips the measured unit 90, but the state of the overhead transport vehicle 1 may be acquired by moving the holding unit 7, which is gripping the measuring unit (first unit member) 80, away from or closer to the measured unit (second unit member) 90 placed on each of the placement tables. With this configuration, the measured unit 90, which is inexpensive relative to the measuring unit 80, is placed on each of the placement tables of the maintenance trestle 150, so that the maintenance trestle 150 can be constructed at a low cost.

Third Modification

In the overhead transport vehicle 1 of the above-described preferred embodiments and the above-described modifications, it has been described, as the state of the overhead transport vehicle 1 to be stored in the storage unit 8A, with an example of the information such as the actual position (X coordinate, Y coordinate, Z coordinate) of the grippers 12 with a predetermined reference position as the origin, the angle $\theta$, the angle $\alpha x$, the angle $\alpha y$, and the like, but it may be set values of the amount of operation of the linear motion mechanisms 67 (amount of movement of the guide rollers) determined based on such information on the actual position (X coordinate, Y coordinate, Z coordinate), the angle $\theta$, the angle $\alpha x$, the angle $\alpha y$, and the like.

Fourth Modification

In the above-described preferred embodiments and some of the above-described modifications, it has been described with an example in which the measured unit 90 having the target plates 93, 94, and 95, which are measurement targets by the measuring unit 80, is disposed on each of the placement tables of the maintenance trestle 150, but in a case of the load port 300, for example, positioning pins or the like formed on a portion where the FOUP 200 is placed may be used, in place of the measured unit 90, as the measurement target of the measuring unit 80, or targets to be the measurement targets may be formed directly on each of the placement tables of the maintenance trestle 150.

Other Modifications

In the overhead transport vehicle 1 of the above-described preferred embodiments, in place of the linear motion mechanism 67 having the function of moving the position of at least one of the second idler rollers 65B in order to move one end of the belt B in the lifting-and-lowering direction, a cam mechanism (position adjuster) having a similar function may be provided.

In the overhead transport vehicle 1 of the above-described preferred embodiments, it has been described with an example of moving one end of the belt B in the lifting-and-lowering direction by moving the position of at least one of the second idler rollers 65B, but it may be configured such that one end of the belt B is moved in the lifting-and-lowering direction by moving the position of the first idler roller 65A in place of the second idler roller 65B.

In the above-described preferred embodiments and the modifications, it has been described with an example of using the ball screw as the linear motion mechanisms 67, but a cylinder, a linear guide, and the like may be used.

The holding unit 7 of the above-described preferred embodiments and the modifications has been described with an example in which one ends of the belts B are connected via the first buffering mechanism 50 and the second buffering mechanism 40, but it may be directly connected to the holding unit 7. The four belts B may be directly connected to the holding unit 7 as is. Alternatively, the three belts B may be connected to the holding unit 7.

In the above-described preferred embodiments and the modifications, it has been described with an example of direct exchange between the overhead transport vehicle 1 and the measuring unit 80 via the communication units, but various pieces of information may be exchanged via the area controller 110.

In addition to the configuration of the measuring unit 80 of the above-described preferred embodiments and the above-described modifications, a measuring unit including a battery and a communication unit, which are integrally configured, may be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A transport vehicle system comprising:
an overhead transport vehicle including a lifter including a gripper to grip an article and operable to be lifted and lowered by a plurality of suspenders;
a measurer to measure a measurement target portion;
a measured portion including the measurement target portion thereon;
a controller configured or programmed to cause the lifter to be lifted and lowered according to a predetermined set value;
a maintenance trestle provided in a traveling area of the overhead transport vehicle and on which a placement table of the measurer is provided; and
a communicator to wirelessly transmit a result of measurement of the measured portion made by the measurer to the controller; wherein
the measured portion is a first unit grippable by the gripper;
the measurer is a second unit placeable on the placement table;
the first unit is placeable on the maintenance trestle in a state of being supported by the second unit placed on the placement table; and
the controller is configured or programmed to cause the gripper to grip the first unit in a state of being supported by the second unit at the placement table of the maintenance trestle and cause the lifter to lift so that the second unit in a state of being placed on the placement table is able to measure the first unit gripped by the gripper, and correct the set value based on a measurement result of the first unit transmitted via the communicator from the second unit in a state of being placed on the placement table.

2. The transport vehicle system according to claim 1, wherein
the overhead transport vehicle includes a body arranged such that the lifter is able to be lifted and lowered with respect to the body by the suspenders being wound and unwound, and a slider to move the lifter in a direction perpendicular or substantially perpendicular to both a transport direction of the overhead transport vehicle and a vertical direction; and
the maintenance trestle includes a first placement table at a position where the article is placeable by lowering the lifter without the overhead transport vehicle activating the slider, a second placement table above the first placement table in the vertical direction and retractable in a horizontal direction from an area above the first placement table in the vertical direction, and a third placement table at a position where the article is placeable by at least the overhead transport vehicle activating the slider.

3. The transport vehicle system according to claim 1, further comprising an area controller configured or programmed to cause the overhead transport vehicle to periodically move to the maintenance trestle.

4. A transport vehicle system comprising:
an overhead transport vehicle including a lifter including a gripper to grip an article and operable to be lifted and lowered by a plurality of suspenders;
a measurer to measure a measurement target portion;
a measured portion including the measurement target portion thereon;
a controller configured or programmed to cause the lifter to be lifted and lowered according to a predetermined set value; wherein
the overhead transport vehicle includes:
a winding drum to lift and lower the lifter by winding and unwinding the suspenders;
at least one guide roller around which the suspenders unwound from the winding drum are wound;
a body supporting the winding drum and the guide roller; and
at least one position adjuster to move a connection portion of the suspenders with the lifter in a lifting-and-lowering direction by moving a relative position of the guide roller with respect to the body; wherein
the controller is configured or programmed to control a movement of the guide roller by the at least one position adjuster based on information about inclination of the lifter;
the controller is configured or programmed to control lifting and lowering of the lifter so that the measurer is able to measure the measured portion by one of the measurer and the measured portion gripped by the gripper and by the other of the measurer at a predetermined position and the measured portion at a predetermined position, and correct the set value based on a result of measurement of the measured portion made by the measurer; and
the set value includes the information about inclination.

5. The transport vehicle system according to claim 4, wherein
one of the measurer and the measured portion is a first unit grippable by the gripper;
the other of the measurer and the measured portion is a second unit placeable at the predetermined position; and
one of the first unit and the second unit is placeable at the predetermined position in a state of being supported by the other of the first unit and the second unit.

6. The transport vehicle system according to claim 5, further comprising:
a communicator to transmit the result of measurement of the measured portion by the measurer to the controller; wherein
the measured portion is used in a state of being gripped by the gripper and the measurer is used in a state of being placed at the predetermined position.

7. The transport vehicle system according to claim 5, further comprising a maintenance trestle that is provided in a traveling area of the overhead transport vehicle and on which a placement table to be the predetermined position is provided.

8. The transport vehicle system according to claim 7, wherein
the overhead transport vehicle includes a body arranged such that the lifter is able to be lifted and lowered with respect to the body by the suspenders being wound and unwound, and a slider to move the lifter in a direction perpendicular or substantially perpendicular to both a transport direction of the overhead transport vehicle and a vertical direction; and
the maintenance trestle includes a first placement table provided at a position where the article is placeable by lowering the lifter without the overhead transport vehicle activating the slider, a second placement table provided above the first placement table in the vertical direction and provided to be retractable in a horizontal direction from an area above the first placement table in the vertical direction, and a third placement table provided at a position where the article is placeable by the overhead transport vehicle activating at least the slider.

9. The transport vehicle system according to claim 6, further comprising a maintenance trestle that is provided in a traveling area of the overhead transport vehicle and on which a placement table to be the predetermined position is provided.

10. The transport vehicle system according to claim 9, wherein
the overhead transport vehicle includes a body arranged such that the lifter is able to be lifted and lowered with respect to the body by the suspenders being wound and unwound, and a slider to move the lifter in a direction perpendicular or substantially perpendicular to both a transport direction of the overhead transport vehicle and a vertical direction; and
the maintenance trestle includes a first placement table provided at a position where the article is placeable by lowering the lifter without the overhead transport vehicle activating the slider, a second placement table provided above the first placement table in the vertical direction and provided to be retractable in a horizontal direction from an area above the first placement table in the vertical direction, and a third placement table provided at a position where the article is placeable by the overhead transport vehicle activating at least the slider.

11. The transport vehicle system according to claim 6, wherein
the overhead transport vehicle includes a body arranged such that the lifter is able to be lifted and lowered with respect to the body by the suspenders being wound and unwound, and a slider to move the lifter in a direction perpendicular or substantially perpendicular to both a transport direction of the overhead transport vehicle and a vertical direction; and
the maintenance trestle includes a first placement table provided at a position where the article is placeable by lowering the lifter without the overhead transport vehicle activating the slider, a second placement table provided above the first placement table in the vertical direction and provided to be retractable in a horizontal direction from an area above the first placement table in the vertical direction, and a third placement table provided at a position where the article is placeable by the overhead transport vehicle activating at least the slider.

12. The transport vehicle system according to claim 4, further comprising:
a communicator to transmit the result of measurement of the measured portion by the measurer to the controller; wherein
the measured portion is used in a state of being gripped by the gripper and the measurer is used in a state of being placed at the predetermined position.

13. The transport vehicle system according to claim 12, further comprising a maintenance trestle that is provided in a traveling area of the overhead transport vehicle and on which a placement table to be the predetermined position is provided.

14. The transport vehicle system according to claim 13, wherein
the overhead transport vehicle includes a body arranged such that the lifter is able to be lifted and lowered with respect to the body by the suspenders being wound and unwound, and a slider to move the lifter in a direction perpendicular or substantially perpendicular to both a transport direction of the overhead transport vehicle and a vertical direction; and
the maintenance trestle includes a first placement table provided at a position where the article is placeable by lowering the lifter without the overhead transport vehicle activating the slider, a second placement table provided above the first placement table in the vertical direction and provided to be retractable in a horizontal direction from an area above the first placement table in the vertical direction, and a third placement table provided at a position where the article is placeable by the overhead transport vehicle activating at least the slider.

15. The transport vehicle system according to claim 4, further comprising a maintenance trestle that is provided in a traveling area of the overhead transport vehicle and on which a placement table to be the predetermined position is provided.

16. The transport vehicle system according to claim 15, wherein
the overhead transport vehicle includes a body arranged such that the lifter is able to be lifted and lowered with respect to the body by the suspenders being wound and unwound, and a slider to move the lifter in a direction perpendicular or substantially perpendicular to both a transport direction of the overhead transport vehicle and a vertical direction; and
the maintenance trestle includes a first placement table provided at a position where the article is placeable by lowering the lifter without the overhead transport vehicle activating the slider, a second placement table provided above the first placement table in the vertical direction and provided to be retractable in a horizontal direction from an area above the first placement table in the vertical direction, and a third placement table provided at a position where the article is placeable by the overhead transport vehicle activating at least the slider.

17. The transport vehicle system according to claim 15, further comprising an area controller configured or programmed to cause the overhead transport vehicle to periodically move to the maintenance trestle.

18. The transport vehicle system according to claim 4, wherein the set value is set for each placement portion for the article;

one of the measurer and the measured portion is used in a state of being gripped by the gripper; and the other of the measurer and the measured portion is used in a state of being formed or placed on the placement portion to be a measurement target.

\* \* \* \* \*